United States Patent

Kurz

[15] 3,646,586

[45] Feb. 29, 1972

[54] ANALOGUE-TO-DIGITAL CONVERTER SYSTEM

[72] Inventor: Rainer Kurz, Oak Ridge, Tenn.

[73] Assignee: Tennelec, Inc., Oak Ridge, Tenn.

[22] Filed: Apr. 28, 1969

[21] Appl. No.: 819,911

[52] U.S. Cl. ........................................................ 340/347 AD

[51] Int. Cl. ........................................................ H03k 13/02

[58] Field of Search ........................................ 340/347; 324/99

[56] References Cited

UNITED STATES PATENTS 3,072,332 1/1963 Margopoulos ........................ 340/347 X 3,493,958 2/1970 Gorbatenko et al. ..................... 340/347

*Primary Examiner*—Maynard R. Wilbur

*Assistant Examiner*—Charles D. Miller

*Attorney*—Fitch, Even, Tabin & Luedeka

[57] ABSTRACT

A serial-parallel analogue-to-digital converter system utilizes a conventional ADC having a relatively low number of channels together with at least one amplifier which may be set at different amplification factors, a conventional digital-to-analogue converter, and an arithmetic device that generates the digital output, to provide a fast conversion and an output having a substantially greater number of channels and a correspondingly high resolution. The conventional ADC is utilized several successive times at increasingly higher sensitivity through the use of the amplifier which may have its gain increased and its zero offset changed with each succeeding use of the ADC. Various means are described which may be employed for reducing or eliminating any errors which could be generated in the operation of this system. Additionally, particular circuit configurations are described which may be advantageously employed in the system for effecting the necessary gain changes with a minimum of error in result and a minimum of circuit complexity.

26 Claims, 10 Drawing Figures

INVENTOR
RAINER KURZ

Anderson, Luedeka, Fitch, Even & Tabin
ATTORNEYS

INVENTOR
RAINER KURZ

Anderson, Luedeka, Fitch, Even & Tabin

ATTORNEYS

INVENTOR
RAINER KURZ

Anderson, Luedeka, Fitch, Even & Tabin
ATTORNEYS

FIG. 5
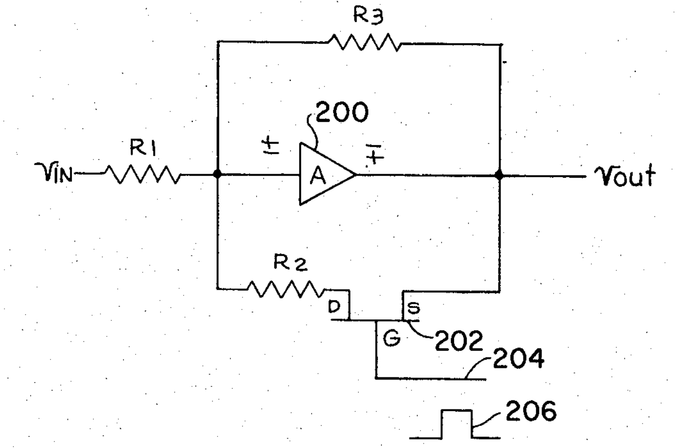
FIG. 6
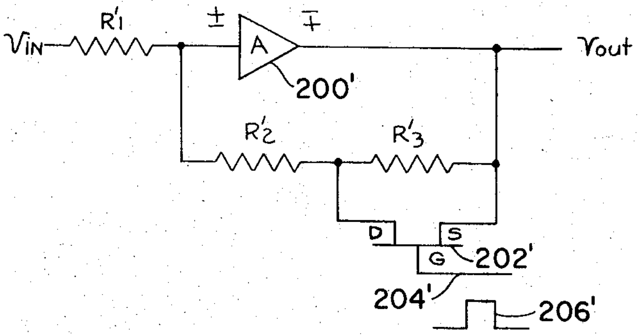
FIG. 7
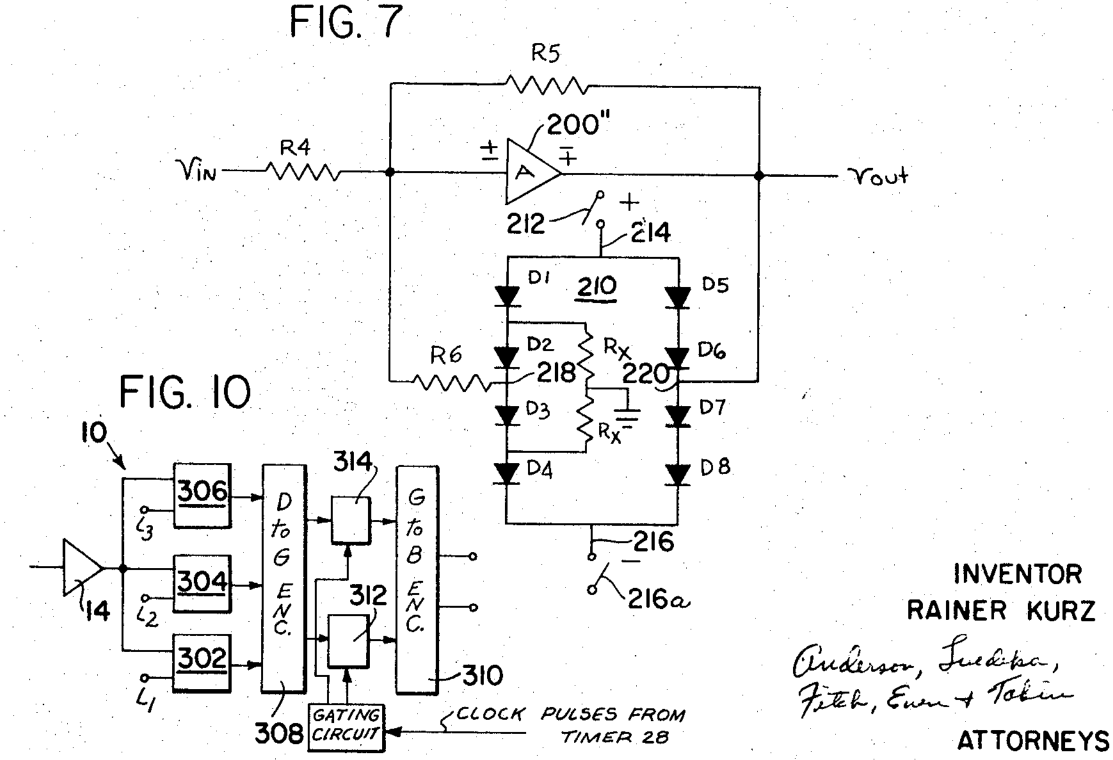
FIG. 10
INVENTOR
RAINER KURZ
Anderson, Luedeka, Fitch, Even + Tabin
ATTORNEYS

ANALOGUE-TO-DIGITAL CONVERTER SYSTEM

The present invention relates to systems for converting data in analogue form to digital form, and more particularly to a system for increasing the digitizing capacity of a relatively low capacity conventional analogue-to-digital converter.

Much of the data fed to digital computers, pulse height analyzers and other digital processing apparatus originates in analogue rather than digital form. That is, the original data information may be a measurement of some physical characteristic such as length, speed, time, pressure, temperature, electric current or voltage, etc., and the data in this form may arise from any number of instruments used to make the particular measurements. Such instruments, regardless of the parameter actually being measured, often provide an output in the form of an analogue voltage or current which may be fed to a suitable meter or other instrument for readout. It is, of course, possible in certain instances for an operator to read the instrument, translate the reading into digital form, and enter the digits into a computer or other digital processing apparatus by way of any of the available conventional input devices, such as perforated tape or card readers, etc. However, it is often desired to carry out the analogue-to-digital conversion automatically and to feed the converted data directly to the digital apparatus. This is especially true where it is desired to perform many operations at high speed and to maintain direct communications between the measuring instrument and the digital processing apparatus for the least probability of errors. Until recently, fast analogue-to-digital converters, in the microsecond range, have had resolutions of six to eight bits. Now, real-time interaction with digital computers, digital processing of radar data and pulse height analysis require converters of both high speed and high resolution.

One of the most commonly used methods of supplementing conventional analogue-to-digital converters is the so-called successive-approximation technique which is essentially a trial-and-error sequence wherein the analogue input voltage is compared with a precise sequence of weighted reference voltages and the difference between the input and the reference determines whether the results of each trial will be accepted or rejected. It has also been heretofore proposed to decrease the conversion time by using a successive-approximation technique to generate several bits simultaneously. In such a technique the analogue input voltage may drive an input amplifier which drives each of a number of comparators. The input is scanned or strobed for trial comparisons by means of a multiple-stage shift register, which may be driven by an internal clock. Each stage of the shift register may be employed to program all of the comparators to make the trial comparisons, the first trial being with respect to full scale, the second with respect to one-quarter scale, the third with respect to one-sixteenth scale, etc. The results of each trial are added to the trial reference values for each succeeding comparison and, after the last trial, the next clock pulse shifts the first pulse inserted into the shift register out of the last register stage where it would normally act as a stop signal to turn off the input gate to prevent further clock pulses from entering the shift register. The data register would then contain the complete digital conversion of the analogue input.

A further type of system heretofore proposed utilizes the so-called subranging technique which generally involves dividing the total input signal range by the number of subranges employed, selecting the appropriate subrange corresponding to the input signal, dividing this into subranges as before, and repeating the operation until the desired resolution is achieved. A prior proposed system utilizing this technique employs two digital-to-analogue converters and a number of comparators which are referenced at equally spaced intervals in the range between the value of the two converters. The system starts with one of the converters at zero and the other at maximum voltage. The output of the comparators indicates which range contains the input signal, which would be between the applied references at two adjacent comparators. The reference voltage from one of these comparators is applied to the first converter, and the reference voltage from the other comparator is applied to the second converter. Thus, another, but smaller set of ranges is generated, and the process is then repeated. If the number of subranges obtained in a single step is reduced to two, this method becomes the successive-approximation technique which was previously mentioned. However, in order to achieve both the extremely high speed and high resolution which are required in some applications, a multitude of comparators is generally required, which may necessarily increase the complexity and the sources of error of such a system.

Other systems, such as the so-called traveling wave conversion technique, have also been proposed, but none provide the speed, resolution and accuracy which are necessary for applications having very severe requirements, while at the same time being relatively economical to manufacture and requiring relatively few components to achieve these ends.

Accordingly, it is an object of the present invention to provide an improved analogue-to-digital converter system having the aforementioned extremely fast speed, high resolution and accuracy for ready real-time interaction with the fastest digital computers and/or other digital processing apparatus, without the necessity of employing such a corresponding multitude of comparators as discussed above.

It is another object of the present invention to provide such an improved analogue-to-digital converter system employing a conventional, relatively low resolution analogue-to-digital converter and means for substantially increasing the digitizing capacity of this converter while maintaining a minimum of error in the digital output.

It is a further object of the invention to provide such a system wherein digital-to-analogue converters are employed together with the conventional analogue-to-digital converter, and any resulting errors in digitization are minimized by placing the burden of accuracy on the digital-to-analogue converters rather than on the analogue-to-digital converter and providing a biasing and amplifying system which will aid in minimizing such errors by coaction with the input analogue signal in such a manner as to optimize the inherent error reduction capabilities of the overall system itself.

It is still a further object of the invention to provide certain improved component parts of the system for providing functional operations therein with a minimum contribution to system errors, during relatively critical periods of the conversion operations.

These and other objects of the invention are more particularly set forth in the following detailed description and in the accompanying drawings, of which:

FIGS. 5 and 6 are schematic diagrams showing alternative forms of certain component parts of the system of FIG. 1;

FIGS. 7 through 9 are schematic diagrams showing alternative preferred forms of certain component parts of the system of FIG. 1; and FIG. 10 is a block diagram of a preferred form of low resolution analogue-to-digital converter with which the system of FIG. 1 may be utilized.

Figure 1:
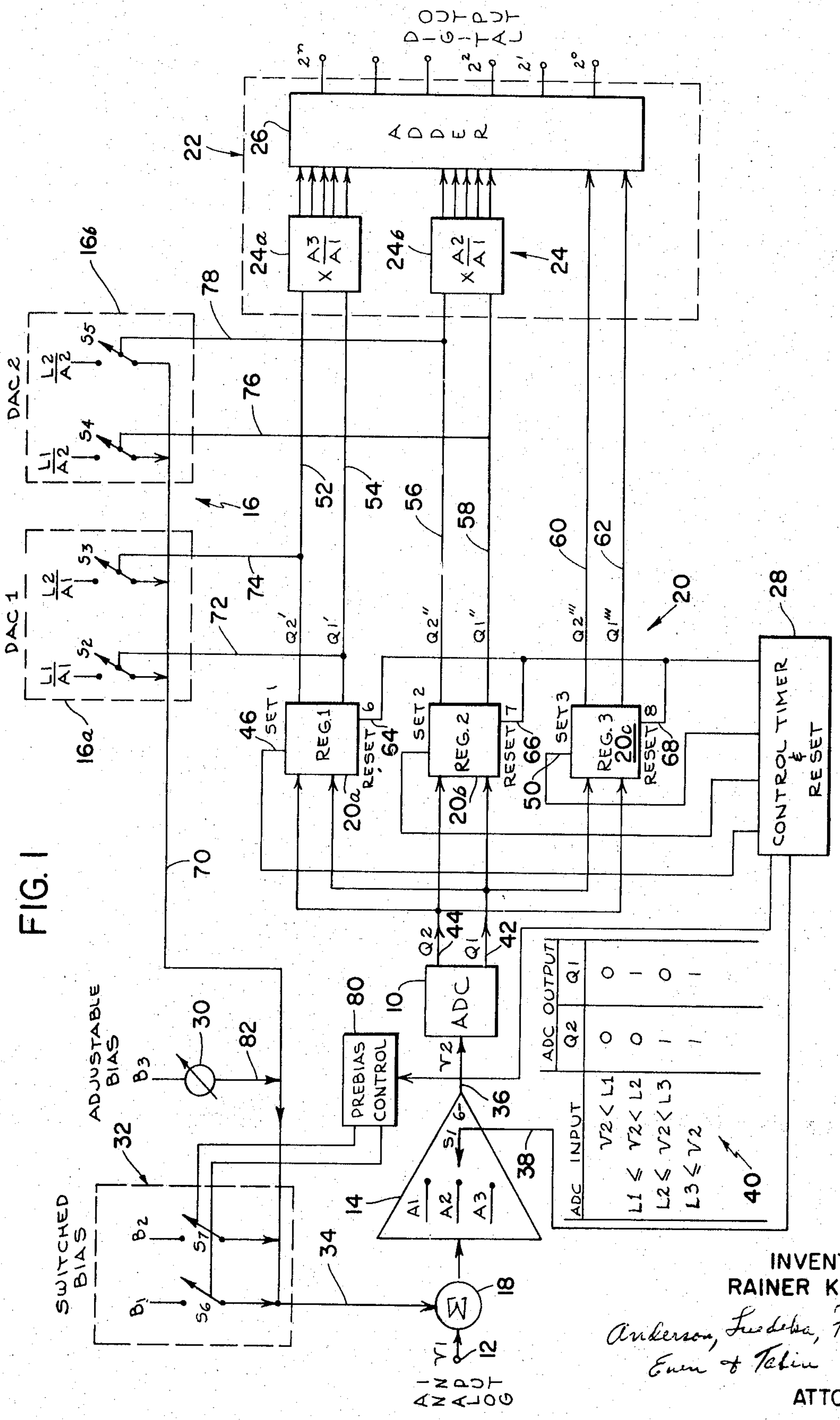
FIG. 1 is a block diagram of the analogue-to-digital converter system in accordance with an embodiment of the invention.

In general, the system shown in FIG. 1 substantially increases the digitizing capacity of a conventional analogue-to-digital converter (hereinafter termed "ADC") 10 having a low number of channels or states by processing the input analogue signal $v_1$, applied to input terminal 12 several times (or in several steps) in rapid succession. In each step the input signal is amplified by successively greater amplification factors by means of variable gain amplifying means 14, while a portion of the signal already processed is automatically biased off, or subtracted, by digital-to-analogue converters (each hereinafter termed a "DAC"), generally illustrated as 16, and means 18 for combining the output of the DACs with the input signal. The residue in each step of analysis is examined in finer detail by the system to thereby effectively increase the total number of channels of the ADC 10 to a substantially larger predetermined number of quantitizing channels into which the input signal is digitized.

The amplifying means 14 in the illustrated embodiment provides an output signal $v_2$ characterized as being the product of the amplification factor of the amplifying means and the algebraic sum of the input signal $v_1$ and the bias, if any. The output of the amplifying means is then directly coupled to the analogue input of the ADC 10.

The amplifying means 14, as illustrated, includes an amplifier with means schematically shown as switch $S_1$ for controllably sequentially varying the amplification factor of the amplifier from a first value, e.g., $A_1$, to a predetermined number of successively higher values, e.g., $A_2$ and $A_3$, each corresponding to a separate step of analysis of the analogue input signal $v_1$. Sequential distributing means, generally illustrated as registers 20, are responsive to the digital output of converter 10 to provide suitably coded gating signals to the DACs 16 and suitably coded information signals indicative of the base number and successive residues to an arithmetic system 22. The DACs 16 provide, during each successive step of analysis, an appropriate analogue feedback signal in the form of a bias which is indicative of the particular output of the ADC 10, and this is thus combined with the analogue input signal by means of the summing circuit 18. The arithmetic system 22 includes multiplying means, generally illustrated as multipliers 24, for providing to an adder 26 signals indicative of the successive products of each digital output of the ADC 10 and an appropriate multiplying factor. The multiplying factor for each successive product is respectively characterized by the ratio of the highest and each successively lower amplification factor to the lowest amplification factor of the amplifier 14 so as to thereby expand, by suitable weighting, the digital output of the ADC 10 from its relatively low number of quantitizing channels to the substantially higher predetermined number of output channels of the overall system. The adder 26 is responsive to each of these products and provides the actual digital output corresponding to the analogue input signal $v_1$.

A timing means, illustrated as control timer and reset circuit 28, is provided for generating electrical clock pulses at predetermined intervals for sequentially varying the amplification factor of the amplifier 14 so that the amplification factor is maintained at its first value $A_1$ during the first of said intervals and is changed or switched to each of its successively higher values, $A_2$ and $A_3$, respectively, during each successive interval of the timer. Suitable leads couple the output pulses to the amplifier circuit 14 and also to the distributing means 20 to selectively gate or register the output of the ADC 10 in sequential fashion to the appropriate one of the DACs 16 and to the appropriate input of the arithmetic system 22 so that the proper feedback bias and multiplier are provided during each step of analysis. The control timer and reset circuit 28 also provide a suitable reset signal at the end of each analysis, or conversion, to restore the amplifier 14 to its initial or original gain $A_1$, and to restore the distributing means 20 to its original no-output condition, in a manner to be described in greater detail hereinafter.

An adjustable biasing means 30 is provided for adjustably suppressing some preselected lower range of input signals so that only that portion of the signal above the suppressed range will be coded by the system. That is, the adjustable biasing means 30 may be utilized to set a particular threshold signal level below which the system does not respond to provide any coded digital output. A further biasing means 32 is provided to supply predetermined amounts of prebias to the analogue input signal for the purpose of minimizing certain types of errors which might arise in the operation of the system. Both biases, together with the feedback DAC bias, may be combined with the input signal at the summing junction 18, as shown; however, they may be combined after amplification as well, in a manner to be hereinafter described.

The nature, effects and operation of the biasing means 30 and 32 will be described in detail after the system, in some of its broader aspects, is described in greater detail below. Then the operation of the illustrated system will be described generally and with several specific examples. An analysis of the various errors which might arise will then analysis of the various errors which might arise will then be presented and a detailed description will then be given of the manner is which the present system minimizes these errors and provides a digital output of extremely high accuracy. Thereafter, a description of several alternative embodiments of the amplifying means 14 will be given together with various preferred and economical circuitry for effecting the required changes in gain and/or prebias, while being adapted for minimization of any system errors.

More particularly then, the input signal $v_1$ is applied to input terminal 12 which is coupled to the summing circuit 18 wherein the input signal $v_1$ is combined by algebraic addition with one or more of the biasing signals, previously discussed, from the DACs 16, the adjustable biasing means 30 and/or the further biasing means 32. Preferably, all of the bias signals are opposite in polarity to the input signal $v_1$ and, in the illustrated embodiment, the input signal $v_1$ must have a greater magnitude than the algebraic sum of the bias signals on lead 34 for a usable output $v_2$ to appear from the amplifier 14 on output lead 36. The amplifier 14 may be set at the different amplification factors, $A_1$, $A_2$ and $A_3$ by the schematically illustrated gain switch $S_1$. Although three different amplification factors are illustrated, it is to be understood that any number of different amplification factors may be utilized, and the principles on which the determination of such number may be made will be described in detail hereinafter in connection with the general theory of operation of the present system. Alternately, of course, several different amplifiers, each having a respective amplification factor of $A_1$, $A_2$ and $A_3$, may be used in place of the single one shown, and the gain selector switch $S_1$ may then be used to select the particular amplifier or amplifiers appropriate to the operation of the system at any particular time in the analysis sequence. The gain selector switch $S_1$ is controlled by the clock pulse generator of the control timer and reset circuitry 28, via lead 38, and the timing sequence of the clock signals on lead 38 will step the switch $S_1$ to each of the amplification factors in succession during each respective step of the analysis operation being performed on the analogue input signal $v_1$.

The output signal $v_2$ from the amplifier 14 is applied to the low-channel conventional ADC 10. The ADC 10 has the properties illustrated in table 40 of FIG. 1. That is, the ADC 10 has three discrete reference levels $L_1$, $L_2$ and $L_3$ which define four quantitizing channels. (The region between two adjacent levels is herein referred to as a "channel" and, for example, if an analogue input signal can have any level from 0 to V volts which can be coded in digital form to indicate N discrete input levels then the N levels define N-1 channels; however, it is sometimes convenient, as in examples later to be described, to consider the channel between zero and the first level the "-zeroth channel" so that N channels would then be defined. In the present example, the channels are assumed to be contiguous without gaps or overlaps. The output of the ADC 10 is straightforward binary code $Q_1$, $Q_2$ on leads 42 and 44, respectively. Thus, for input signal levels to ADC 10 less than $L_1$, the outputs $Q_1$ $Q_2$ are at the logical zero level. If the input signal equals or exceeds level $L_1$ but is less than level $L_2$, output $Q_1$ switches to the logical one level, indicative of binary "01" or decimal "1." If the input signal equals or exceeds level $L_2$ but is less than level $L_3$, output $Q_1$ switches to logical zero and output $Q_2$ switches to logical one, indicative of binary "10" or decimal "2." If the input signal $v_2$ equals or exceeds level $L_3$, both outputs $Q_1$ and $Q_2$ switch to their logical one state, indicative of binary "11" or decimal "3." The successive differences between switching levels 0 and $L_1$, $L_1$ and $L_2$, and $L_2$ and $L_3$ are preferably a constant value, i.e., $L_2$ equals $2L_1$, $L_3=3L_1$, and $L_3=L_1+L_2$, but this is not necessary to the practice of the present invention. Furthermore, of course, the ADC 10 may have a greater number of transition or reference levels than three, as shown in FIG. 1 and would in such case require more than the two output lines 42 and 44. The particular number of transition levels will depend on the particular overall requirements of the system and its design parameters which may be selected as desired in accordance with the present teachings of the invention. Also, although the ADC 10 converts the analogue input signal to a binary code, other codes may of course be alternatively used as a matter of engineering expediency in connection with the particular type of circuitry employed or any special requirements desired.

The binary coded output from the ADC 10 is applied to the distributing means 20 which includes three registers 20*a*, 20*b* and 20*c* having their respective inputs each coupled in parallel-branch form to the output leads 42 and 44 of ADC 10. The number of registers will generally equal the number of successive steps in the analysis operation of the system and, in the particular embodiment illustrated, three steps and three registers are employed. Of course, the number of registers may be more or less than shown, depending upon the particular number of successive analysis steps employed in any particular system. Each of the registers 20*a*, 20*b* and 20*c* may be of any suitable conventional type which receives a digital input signal at a pair of input terminals and then provides this signal at a pair of output terminals at the command of a set pulse applied to a set terminal, illustrated as set terminals 46, 48 and 50 in each respective register. The transfer of the digital input data to the output terminals is initiated at the beginning of a set pulse and the digital information at the output lines of each respective register, 52 and 54, 54 and 56, and 56 and 58, is locked to the digital information existing at the input lines of the respective register at the termination of the set pulse. Thereafter, the information at the output lines will not change, regardless of the state of the input lines coupled to the output of ADC 10, until a reset signal is applied to the respective reset terminals 64, 66 and 68 of the registers. The reset signals clear and restore the register output levels to logical zero.

In the illustrated embodiment, the binary coded signals on the register output lines will correspond to the binary coded information on the output lines 42 and 44 of ADC 10 and hence the output lines of each register are designated $Q'_1$ and $Q'_2$, $Q''_1$ and $Q''_2$ and $Q'''_1$ and $Q'''_2$, respectively. Thus, when a set signal is applied to a particular register, the output terminals of that register will automatically assume the binary code on the output terminals of ADC 10. The set signals are applied to each of the registers 20*a*, 20*b* and 20*c* in succession by the pulses generated from the control timer and reset circuit 28 which also supplies a suitable reset signal to each of the registers at the end of an analysis operation. The application of a set pulse to terminal 46 of register 20*a* initiates the first step of analysis, the application of a set pulse to the second register 20*b* initiates the second step of analysis and the application of a set pulse to the third register 20*c* initiates the third step of analysis.

Each register, except the last or third register 20*c*, controls a digital-to-analogue converter, or DAC, 16*a* and 16*b* which supplies a particular analogue voltage in the form of a bias signal on a common output or feedback lead 70 and lead 34 which is combined with the analogue input signal $v_1$ by means of the summing circuit 18. Each of the DACs 16*a* and 16*b* includes two control switches, schematically indicated as $S_2$ and $S_3$ in 16*a*, and $S_4$ and $S_5$ in 16*b*. The position of each of these switches is controlled by the signals appearing on the output leads of the first two registers 20*a* and 20*b* so that $Q'_1$ controls switch $S_2$, $Q'_2$ controls switch $S_3$, $Q''_1$ controls switch $S_4$, and $Q''_2$ controls switch $S_5$, via respective leads 72, 74, 76 and 78. These switches may take the form of relays or electronic relays of any suitable type, and each switch is arranged so as to be in its open position when its respective control signal is in a "zero" state and in its closed position when its respective control signal is in a "one" state. Consequently, the binary code output of the first register 20*a* controls the switching configuration of the DAC 16*a* and the output of the second register 20*b* controls the switching configuration of the DAC 16*b*. Each switch in each DAC applies a different bias to the common output lead 70 and where more than one switch is closed the bias on lead 70 equals the algebraic sum of the individual biases applied. More specifically, switch $S_2$ controls a bias signal of magnitude $L_1/A_1$, where $L_1$ is the magnitude of the first threshold level of the ADC 10 and $A_1$ is the initial amplification factor of the amplifier 14. Switch $S_3$ controls a bias signal of magnitude $L_2/A_1$, where $L_2$ is the magnitude of the second threshold level of ADC 10. Switch $S_4$ controls a bias signal of magnitude $L_1/A_2$ and switch $S_5$ controls a bias signal of magnitude $L_2/A_2$, where $A_2$ is the second successive amplification factor of the amplifier 14. Since the switches $S_2$ and $S_3$ are controlled, respectively, by the output leads 52 and 54 of the first register and the switches $S_4$ and $S_5$ are controlled, respectively, by the output leads 56 and 58 of the second register, the output bias levels from the DAC 16*a* and 16*b* are coded in a binary sequence themselves.

In the first step of analysis, when the control timer 28 applies a set pulse to the first register 20*a*, the DAC 16*a* may provide a bias of either 0, $L_1/A_1$, or $(L_1+L_2)/A_1$, depending on the particular binary output of the ADC 10. However, this bias is not used during the first step of analysis but during the second step. During the second step of analysis, when the control timer gates the input of the second register 20*b* to the output leads 56 and 58, the second DAC 16*b* may provide any of the bias signals 0, $L_1/A_2$, or $(L_1+L_2)/A_2$. This bias is not used during the second step of analysis but during the third step. During the third step of analysis the particular analogue output of DAC 16*b* would be added to the analogue of DAC 16*a*, whatever that might have been from the first step of analysis. All of the bias signals are actually negative with respect to the analogue input signal $v_1$ so the combined input signal to the amplifier 14 equals $v_1$ minus the bias signal on lead 34, or on lead 70, assuming that there is no adjustable bias supplied by biasing means 30 and no preselected bias levels supplied by the further biasing means 32. This assumption will be made throughout this portion of the discussion for facilitating an understanding of the system operation.

Thus, considering, for example, the second step of analysis where it is assumed that the ADC 10 provides a binary output 01 and the first DAC 16*a* supplies a bias level of $L_1/A_1$ to the combining circuit 18, the amplifier 14 will amplify the difference between $v_1$ and $L_1/A_1$. With the amplifier having a gain of $A_2$ in this second step of analysis, the amplifier output $v_2$ will equal $A_2(v_1-L_1/A_1)$ or $A_2v_1-L_1$. That is, the effect of the bias signal $L_1/A_1$ on the ADC 10 is to subtract a signal of magnitude $L_1$ from its input. Likewise, when switch $S_3$ of the DAC 16*a* is closed, a signal of magnitude $L_2$ is subtracted from the input of the ADC 10, and when both $S_2$ and $S_3$ are closed, the sum of the signals $L_1$ and $L_2$ are subtracted, this sum equaling $L_3$ which is the third threshold level of the ADC 10.

The second DAC 16*b* will have its switches $S_4$ and/or $S_5$ operated at the end of the second step of analysis in response to the output of the second register 20*b*. During the third step of analysis the amplifier 14 will have an amplification factor or gain of $A_3$. Therefore, in a like manner, the application of biases $L_1/A_2$ and $L_2/A_2$ will again subtract signal levels $L_1$ and $L_2$, respectively, from the input to the ADC 10. Also, where both biases are applied, the sum of $L_1+L_2$ will be subtracted which, again, equals the third threshold level of the ADC 10, $L_3$.

Although the bias levels from the first and second DAC's 16*a* and 16*b* are coded in a binary sequence, the principles of the invention are not limited to any particular coding sequence. However, this sequence may be the most economical of the number of DAC levels required; but in any case, any sequence which permits a one-to-one correspondence of ADC threshold levels and total DAC levels for each state of amplification is preferred.

Each of the registers, except the last register 20c, in addition to controlling its corresponding DAC 16a and 16b, respectively, controls parallel digital multipliers 24a and 24b. Each multiplier contains as many output lines as is necessary to transmit the required coded multiple to the digital adder 26. Each of the multipliers 24a and 24b sequentially provide, during the first two successive steps of the analysis, signals indicative of the respective products of the output from each respective register 20a and 20b and a multiplying factor, which factor, corresponding to each of the multipliers, is generally characterized by the ratio of the highest amplification factor and each successively lower amplification factor to the lowest amplification factor of the amplifier 14. Thus, there is provided a weighting factor in each successive step of the analysis which is a "complement" of the register output necessary to expand that output to the substantially larger number of quantitizing channels of the output of the adder 26. More specifically, the multiplier 24a multiplies its input by the factor $A_3/A_1$ and multiplier 24b multiplies its input by the factor $A_2/A_1$. In accordance with the general expression of the ratio relationships, no multiplier is required for the third or last step, since the multiplier is $A_1/A_1=1$. The output of the adder 26 may be coded in any suitable manner to meet the requirements of whatever readout device may be coupled thereto.

The illustrated system also includes the two bias networks 30 and 32, as previously stated. The bias network 32 allows preselected or preset bias levels to be switched in or out under control of a preset-bias control circuit 80 which independently controls each of the bias switches $S_6$ and $S_7$ which, in turn, respectively control the bias signals $B_1$ and $B_2$. The preset-bias control 80 is under the control of the clock pulses from the timer 28 which maintains the appropriate sequence of operations in the overall system, and causes $B_1$ and $B_2$ to be switched in at appropriate steps of the analysis. The biases $B_1$ and $B_2$ are utilized in connection with the minimization of errors in the system and will be described hereinafter in that connection. The bias $B_3$ is preferably a DC level which is continuously adjustable by the system operator by means of the variable control 30 such as a potentiometer or other suitable device, for the purpose of biasing off the range of input signals $v_1$ below the output level set by the control 30 on lead 82 so that the threshold, or actual zero level, of the system input need not necessarily correspond to the analogue input signal $v_1=0$.

It is understood, of course, that the specified signals previously mentioned, and to be hereinafter further discussed, may be either voltages or currents, and the choice of parameter will be merely a matter of engineering expediency and not fundamental to the operation of the system. Accordingly, amplifier 14 may be a voltage amplifier or a current amplifier, depending on the overall environment of the system. Thus, where signal voltages are specified in the description of the exemplary embodiment of the system, signals in the form of currents may be substituted therefor if the system is operating on a current rather than a voltage basis.

Figures 2, 4:
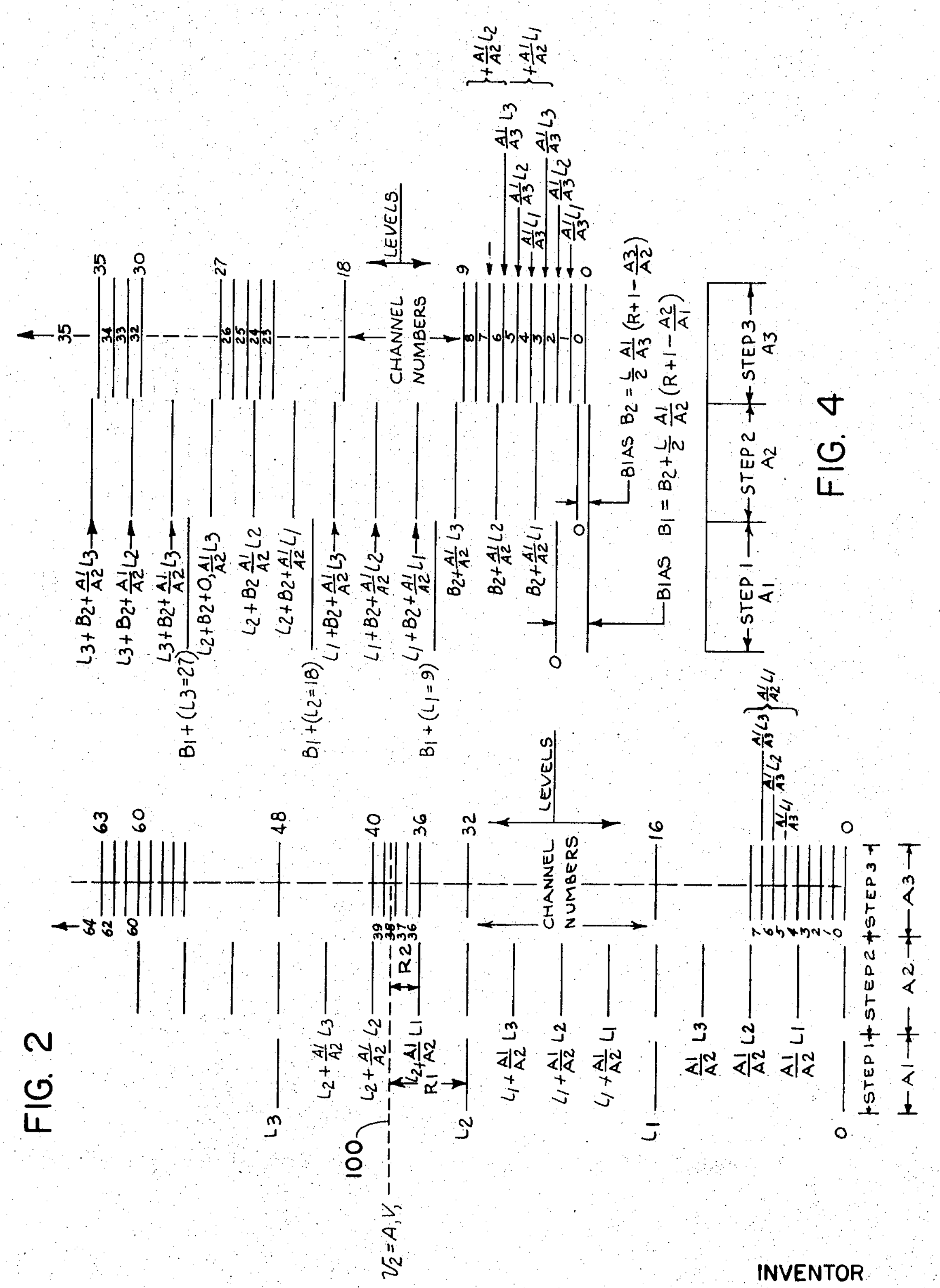
FIG. 2 is a graphical illustration showing one mode of operation of the system of FIG. 1 to facilitate a general understanding of the principles thereof.
FIG. 4 is a graphical illustration showing an example of a second mode of operation of the system of FIG. 1.

Reference is now made of FIG. 2 as an aid in describing qualitatively the general theory on which the operation of the apparatus of a possible but simplified embodiment of the invention can be based. This simplified example or mode of operation has several shortcomings and it will be shown in a later described, more preferred, example how these shortcomings can be overcome. FIG. 2 shows the threshold levels referred to input terminal 12 for a system having 63 equal-width channels (the first or lowest channel counted as channel zero) and a 64th channel (channel 63) representing any overflow. The various discrete levels are shown as horizontal lines which are distributed in three vertical columns, each column representing one of the three steps of analysis in the present example. Each step also represents a time interval, determined by the clock pulses from the control timer 28, during which the output signal $v_2$ of amplifier 14 may be allowed to come to equilibrium after the application of an input signal $v_1$ and/or any of the bias signals previously mentioned. The effects of the bias signals obtained from the biasing means 30 and 32 are omitted from this diagram because they are not applicable to this example.

An input signal $v_1$ is assumed to be at a level $V_1$, and it is further assumed that $v_1$ remains constant at $V_1$ for the duration of the analysis. Additionally, it is assumed that the conventional ADC 10 of FIG. 1 has the previously described three equally spaced thresholds, $L_1$, $L_2$ and $L_3$ wherein $L_2=2L_1$ and $L_3=3L_1$. The ratio of gain steps of amplifier 14 is assumed to be 4. That is, $A_2/A_1=4$, and $A_3/A_2=4$. Thus it follows that the ratio of $A_3$ to $A_1$ is 16 ($A_3/A_1=16$). Since the ADC 10 can be in any of four different states, as can be seen from Table 40, and since the sensitivity of the ADC 10 is increased four times in each of two succeeding steps by the amplifier 14, the total number of possible states (or channels) of the overall system becomes 4×4×4=64.

At the start of the sequence, amplifier 14 has a gain of $A_1$ and all of the switches in DAC 16a and 16b are open. The input signal to the ADC 10 is $v_2=A_1V_1$ and is shown as dotted line 100 in FIG. 2. As there shown, the threshold $L_2$ is exceeded. Since $L_2$ represents two channels of digital information at the end of step one, but 32 channels of digital information at the end of step three, the result from the digitization in step one must be expanded or multiplied by a weighing factor $A_3/A_1=16$ before the number appears at the output. This is accomplished by the multiplier 24a which receives the binary code 10 (or "2" in decimal) from the ADC 10 through the first register 20a and supplies the multiplied output of 32 (16×2) to the adder 26 which retains this figure in digital form.

The binary 10 code from the first register 20a is also applied to the first DAC 16a, and the logical one code on $Q'_2$ closes the switch $S_3$ and applies a bias of $L_2/A_1$ to the summing circuit 18. As previously explained, the signal applied to the ADC 10 as the new value of $v_2$ is the amplified portion of $A_1V_1$ in excess of $L_2$. This excess is herein referred to as the residue $R_1$ and is illustrated in step one of FIG. 2. However, simultaneously with the application of bias $L_2/A_1$, the amplifier gain may be increased to $A_2$ which, from our previous assumption, provides an increased ratio of $A_2/A_1=4$. With respect to the input signal at terminal 12, this process has the effect of reducing the threshold levels of the ADC 10 by a factor $A_1/A_2=1/4$. These new effective reference levels for the ADC 10 are illustrated in the "step two" portion of FIG. 2. Thus, in step two, the first threshold $L_1$ of ADC 10 has been exceeded and its output switches to the binary code 01 which is fed to the inputs of the registers 20, and a clock pulse from the control timer 28 sets the register 20b to apply the input to the output leads 56 and 58 which then assume the same binary code. This digitization must carry a weight of $A_2/A_1=4$ channels in the final output, and this weighting factor is provided by multiplier 24b with the product being fed to and retained by the adder 26. That is, the digital output in step two is multiplied by the ratio of the amplification factor in the next-to-last step to the amplification factor in the first step. In this instance, it also equals the ratio of the amplification factor in the last step to the amplification factor in the second step. Additionally, the logical one state on the output $Q''_1$ of the second register 20b causes the switch $S_4$ to close which applies the bias $L_1/A_2$ to the summing circuit 18 in the same manner as previously described. This bias combined with the input signal $v_1$ and the previous bias $L_2/A_1$ produces the residue $R_2$ at the summing point 18. Simultaneously with the application of the bias $L_1/A_2$, the amplification factor of the amplifier 14 may be switched to $A_3$. This now effectively reduces each threshold reference level of the ADC 10 by a factor of $A_1/A_3$.

Thus, looking ahead to the third step of FIG. 2, the ADC 10 provides four channels between each of the channels in step two, wherein each reference level in step two becomes the new zero level with respect to the reference levels of the ADC 10 in step three. The amplified residue $R_2$ exceeds the second reference level of the ADC 10 which corresponds to the 38 level in channel 38 of the output. Thus, the ADC 10 switches its output to the binary code 10 which is applied to the input of the registers 20, and this input to register 20c is gated to its output leads 60 and 62 by the clock pulse from generator 28 at the end of the third step. Leads 60 and 62 are coupled directly to the adder 26. No multiplier is needed here since all of the weighting was done with respect to the final predetermined number of channels in the output, i.e., 64, but following the same progression as the multipliers 24a and 24b, the multiplier in the third step of the analysis would theoretically have the multiplication factor $A_1/A_1=1$, as previously stated. The adder 26 receives the weighted fundamental or base reference and the successive weighted references generated by residues $R_1$ and $R_2$ to sum the total digital input thereto and provides a digitized output according to any particular code as desired. In the example hereinbefore described, the total channel count at the output then becomes 2×16 (from step one)+1×4 (from step two)+2 (from step three)=38.

The principles of relationship on which the operation of the present system is based may now be stated more quantitatively by the following generalized formula for any number of output channels, N, assuming that all threshold levels of the basic low-state ADC (10) are separated by a constant amount:

Equation 1

$$N=\sum_{1}^{m} N_i$$

and $$N_1=\left(\frac{A_m}{A_1}\right) kH\,[A_1v_1-L_k]$$

$$+\left(\frac{A_m}{A_1}\right)(k-1)\,H\,[A_1v_1-L_{(k-1)}]\,H\,[L_k-A_1v_1]$$

$$\vdots$$

$$+\left(\frac{A_m}{A_1}\right) 1H\,[A_1v_1-L_1]\,H\,[L_2-A_1v_1]\ldots H\,[L_k-A_1v_1]$$

$$N_2=\left(\frac{A_{(m-1)}}{A_1}\right) kH\,[A_2(v_1-N_1L_1)-L_k]$$

$$+\left(\frac{A_{(m-1)}}{A_1}\right)(k-1)\,H\,[A_2(v_1-N_1L_1)-L_{(k-1)}]$$

$$H\,[L_k-A_2(v_1-N_1L_1)]$$

$$\vdots$$

$$+\left(\frac{A_{(m-1)}}{A_1}\right) 1H\,[A_2(v_1-N_1L_1)-L_1]\,H\,[L_2-A_2(v_1-N_1L_1)]\ldots H\,[L_k-A_2(v_1-N_1L_1)]$$

$$\vdots$$

$$N_i=\left(\frac{A_{(m-i+1)}}{A_1}\right) kH\left[A_i\left(v_1-L_1\sum_{1}^{i-1}N_n\right)-L_k\right]$$

$$+\left(\frac{A_{(m-i+1)}}{A_1}\right)(k-1)H\left[A_i\left(v_1-L_1\sum_{1}^{i-1}N_n\right)-L_{(k-1)}\right]$$

$$H\left[L_k-A_i\left(v_1-L_1\sum_{1}^{i-1}N_n\right)\right]$$

$$\vdots$$

$$+H\left[A_i\left(v_1-L_1\sum_{1}^{i-1}N_n\right)-L_1\right]$$

$$H\left[L_2-A_i\left(v_1-L_1\sum_{1}^{i-1}N_n\right)\right]\ldots$$

$$H\left[L_k-A_i\left(v_1-L_1\sum_{1}^{i-1}N_n\right)\right]$$

Where $N$ is total number of channels recorded in a single complete analysis, $N_i$ is the number of channels recorded at the $i$th step of the analysis, $N_n$ is the number of channel counts recorded during an earlier step of the analysis, $m$ is the number of steps in the analysis and, therefore, the number of gain settings of the amplifier, $A_i$ is the amplifier gain at the $i$th step in the analysis, where $i$ can vary from 1 to $m$, $v_1$ is the input voltage (or current) which remains constant during an analysis, $L_1$ is the threshold voltage (or current) of the first level in the low-state ADC, $k$ is the number of levels above zero which the low-state ADC can quantitize, $L_k$ is the topmost or highest quantitizing level of the low-state ADC, and $H$ is the Heaviside operator ($H$ [X]=0 if X is a negative quantity, $H$[X]=1 if X is a positive quantity).

In $N_i$ above, if we examine the $(k-1)$th term:

$$\left(\frac{A_{(m-i+1)}}{A_1}\right)(k-1)\,H\left[A_i\left(v_1-L_1\sum_{1}^{i-1}N_n\right)-L_{(k-1)}\right]$$

$$H\left[L_k-A_i\left(v_1-L_1\sum_{1}^{i-1}N_n\right)\right]$$

it will be seen that this term will be nonzero if, and only if, the residue at the end of the $i$th step exceeded the $(k-1)$th level, but not the $k$th level. Otherwise, of course, it will be zero.

If this term is not zero, then the residue is $$A_i\left(v_i-L_1\sum_{1}^{i-1}N_n\right)-L_{(k-1)}$$

and must be positive. $A_i$ is the amplification existing at the step under consideration, i.e., the $i$th step. The term $$L_1\sum_{1}^{i-1}N_n$$

expands to $N_1L_1+N_2L_1+\ldots N_{i-1}L_1$ and represents the sum of all of the DAC levels switched in during the $i-1$ preceding steps. The term $L_{(k-1)}$ is the $(k-1)$th level of the low-state ADC. The factor $A_{(m-i+1)}/A_1$ in the $(k-1)$th term is the weighting factor by which the output count $(k-1)$ of the ADC must be multiplied before summing it in the final adder.

The total number of channels which the system is capable of quantitizing is

Equation 2

$$\left[\frac{A_m}{A_1}(k+1)\right]-1$$

where the symbols have the same meaning as in Equation 1.

Applying the general formulas developed above and referring to FIG. 1 again, a specific example may be considered where the following parameters are assumed:

$k=3$ levels which ADC 10 can quantitize, corresponding to $k+1=4$ possible states in the ADC 10.

$m=3$ steps in the quantitizing process.

$A_1=1$, the amplifier 14 gain during the first step of quantitization.

$A_2=4$, the amplifier 14 gain during the second step of quantitization.

$A_3=16$, the amplifier 14 gain during the third and final step of quantitization.

From the preceding description it follows that the number of channels which this system will quantitize is, from equation 2, (4)(16/1)−1=63 (counting the channel between the zero level and the first level as the zeroth channel). To simplify the explanation, it is assumed that the signal parameter is voltage and that one channel, i.e., the difference between successive levels of quantitization in the final result, is 1 volt. The reference levels of the ADC 10 should then be spaced by $(A_2)/(A_1)A_3/A_2$=16 volts. That is, $L_1$=16 volts, $L_2$=32 volts and $L_3$=48 volts. In the first DAC 16a the bias levels controlled by switches $S_2$ and $S_3$ are, respectively, 16 volts and 32 volts, and in the second DAC 16b the bias levels controlled by switches $S_4$ and $S_5$ are, respectively, 4 volts and 8 volts. Since 1 volt equals one channel when referred to the input, the bias levels can be thought of as channels. Digital multipliers 24a and 24b have multiplication factors, respectively, of 16 and 4. Assume for this example that the bias networks 30 and 32 are disconnected.

Using the preceding information, Equation 1 can be written as follows:

$$N=N_1+N_2+N_3 \qquad (3)$$

$$N_1=48H[v_1-48]+32H[v_1-32]H[48+v_1]+16H[v_1-16]H[32-v_1]H[48-v_1]$$

$$N_2=12H[4(v_1-N_1)-48]+8H[4(v_1-N_1)-32]H[48-4(v_1-N_1)]+4H[4(v_1-N_1)-16]H[32-4(v_1-N_1)]H[48-4(v_1-N_1)]$$

$$N_3=3H[16(v_1-N_2)-48]+2H[16(v_1-N_1-N_2)-32]H[48-16(v_1-N_1-N_2)]+H[16(v_1-N_1-N_2)-16]H[32-16(v_1-N_1-N_2)]H[48-16(v_1-N_1-N_2)]$$

It will be noted that the last Heaviside factor in the last term of each of the above expressions is actually redundant, being always equal to one, but they are included here nevertheless for the sake of completeness.

Figure 3:
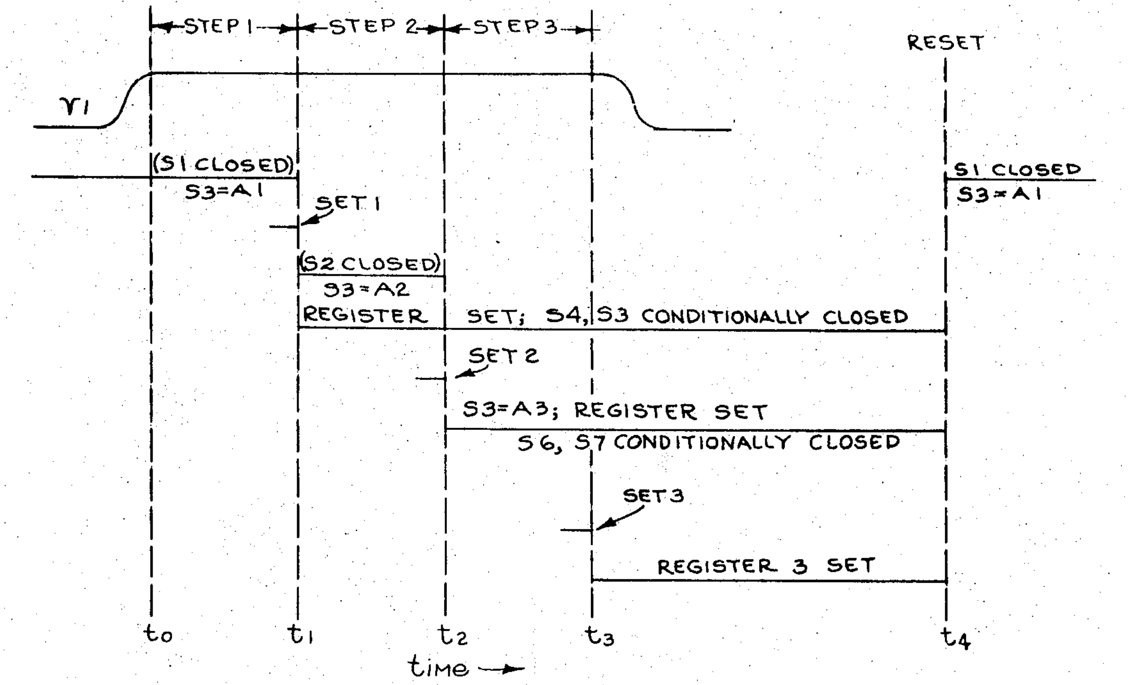
FIG. 3 is a timing diagram illustrating the sequence of operation of various ones of the components in the system of FIG. 1.

Referring now to FIGS. 1, 2, and 3, the sequence of events which occur during the quantitization of an input pulse $V_1$ of 38.5 volts will be traced to summarize the operation of the system. Since, in this example, volts are equal to channel counts, 38.5 volts corresponds to 38 channels where the channel defined by the zero- and 1-volt levels is the zeroth channel. Therefore, the numbers designating the channels in FIG. 2 will be appropriate for the purpose of this example.

With reference to the timing diagram of FIG. 3, the input signal $v_1$ is seen to begin prior to time $t_0$ and to end after $t_3$. The exact starting time of $v_1$ is generally important only insofar as equilibrium within a fraction of one channel is attained by the end of step one. The end or termination of $v_1$ is unimportant so long as it occurs after the end of step three and before a new timing sequence commences. During step one, switch $S_1$ is in the $A_1$=1 position. Since the input signal is 38.5 volts, the only factors in equation three which are positive are $H[v_1-32]$ and $H[48-v_1]$, making $N_1$=32. The second level in the ADC 10 is triggered, setting the output lines Q2 and Q1 in the one and zero state, respectively. At the end of step one a "-set" pulse is applied to the set terminal 46 of the first register 20a which locks its two output lines $Q_2'$ and $Q_1'$ in the one and zero states, respectively. With $Q_2'$ in the one state, $S_3$ is closed which applies a feedback bias of $L_2/A_1$=32 volts to summing junction 18. Thus, the residue applied to amplifier 14 at the beginning of the second step is 38.5−32=6.5 volts. Simultaneously, the "2" count, corresponding to $Q_2'$ being in the one state, is multiplied by 16 to apply a count of 32 to the adder 26.

At the start of step two, $S_1$ is in the $A_2$=4 position and the first register 20a is locked. The signal applied to the ADC 10 is the residue from step one multiplied by $A_2$=6.5×4=26 volts. This signal is large enough to trigger the first level, but not the second level in ADC 10. In Equation 3, only the "4" count line of $N_2$ has positive factors for the Heaviside terms. Thus, at the end of step two, a "set" pulse from the control timer 28 locks the second register 20b in the binary 01 state wherein $Q_1''$=1, $Q_2''$=0. The second register, in turn, locks $S_4$ in DAC 16b closed, adding a bias to summing junction 18 of $L_1/A_2$ =16/4=4 volts to the bias of 32 volts already there from step one, and adding (1) $A_2/A_1$=4 counts to the adder 26.

At the start of the third step, the residue from the preceding steps is $v_1-L_2/A_1-L_1/A_2=v_1-N_1-N_2$=38.5−32−4=2.5 volts. Switch $S_1$ is now in the $A_3$ position and the residue is multiplied by 16 to provide a signal of 16 times 2.5=40 volts to ADC 10. This signal exceeds the $L_2$=32 volts threshold, but not the $L_3$=48 volts threshold, and sets the ADC output lines in the $Q_3$=0, $Q_2$=1 position for a 10 binary count. At the end of step three a "set" pulse via terminal 50 locks the third register 20c in the $Q_1'''$= 0, $Q_2'''$=1 position, and according to the $N_3$ component of equation three, adds two counts to adder 26.

The count in adder 26 is now 32+4+2=38, corresponding to 38 channels, which is correct for an input of more than 38 volts but less than 39 volts. This information in the adder 26 is now ready for readout or destruction. The system is cleared by applying reset pulses, in any order, or simultaneously, from the control timer and reset circuitry 28 to all the registers as well as to the amplifier 14 for resetting the switch $S_1$ to the $A_1$ position. When the registers clear, all of the switches in the DAC's 16a and 16b return automatically to their normally open positions.

In accordance with a further aspect of the present invention, as previously indicated, various means are provided for reducing or eliminating the effects of the sources of error in the system. For example, it can be shown, as described below, that if one of the threshold levels of the low-state or sub-ADC is lower than it should be, as measured by the relationships developed above, a gross error in channel count can result. However, it has been found that this error may be reduced by prebiasing the input signal in a particular manner and making the ratio increase in amplifier gain less than the number of channels in the low-state ADC. Also, if the ratio increase in amplifier gain factor between steps of analysis is equal to the number of channels in the original or low-state ADC, then any errors in the threshold levels of this ADC will appear as changes in channel width of the final results. However, it has been found that it will not occur if the ratio increase in amplifier gain factor is less than the number of channels in the original ADC by an amount to be hereinafter discussed.

The principal sources of error occur in the analogue portion of the system and are generally due to the amplifier 14, the sub-ADC 10, bias networks 30 and 32, and the DAC's 16a and 16b. The digital portion comprising the registers 20, the multipliers 24 and the adder 26 generally cause errors only by a gross failure to operate as intended or because the sequence of operations is incorrect. The errors arising in the analogue portion of the system, will now be discussed.

The errors which may arise in amplifier 14 are generally due to DC offset at the input and nonlinearity in response over the required dynamic range. Input offset has the effect of adding to or subtracting from the base line of the input signal and affects all channels alike. The input offset can be cancelled by introducing an equal but opposite offset with adjustable bias means 30. And, this is the principal purpose of the adjustable bias provision.

Nonlinearity of response in the amplifier 14 has the effect of making some channels have different widths than others. By various standard and well-known techniques, such as suitable feedback, the use of constant-current load networks, and others, none of which, per se, form the subject of the present invention, it is possible to cause the amplifier to be as linear as required to perform in accordance with the principles of the present invention.

Because the bias obtained from the adjustable bias network 30 combines directly with the input signal, it directly affects the base line from which the input signal is digitized, and an error in this base line will affect all channels alike. Although the bias obtained from DAC's 16a and 16b also combine directly with the input signal and errors therein directly affect the accuracy of the digitizing process, unlike bias network 30, each bias component in the DAC will affect only select portions of the input signal. Thus, the bias introduced by $S_3$ in DAC 16a has a weight of $L_2/A_1$=32 volts in the numerical example given above, and an error in this bias value will offset the 32nd and all higher channels. Similarly, an error in the biasing introduced by $S_2$ will affect the accuracy of the 16th and all higher channels. An error in the bias switched in by switch $S_5$ in DAC 16*b*, however, acts somewhat differently. It has a weight in the analysis of $L_3/A_2=32/4=8$ channels, but it does not enter until the second step of the digitizing process. Thus, it can affect only channel numbers 8 through 15, 24 through 31, 40 through 47, and 56 through 63. The bias controlled by $S_4$ carries a weight of four channels and this four-channel group will be equally spaced throughout the spectrum of channels, as illustrated in FIG. 2.

Since an absolute error $\epsilon$ in the value of any bias network will produce an error of $\epsilon$ in the channels which it affects, it follows that the fractional error occurring in a bias network will be lower, the larger the absolute value of the bias. For example, if there is assumed a tolerable error of 0.1 channel in the numerical example given above, then the tolerable fractional error in the network controlled by, for example, $S_3$ is 0.1/32 or one part in 320 and only 0.1/4 or one part in 40 in the network controlled by $S_4$ because these networks have weights of 32 and 4 channels, respectively.

Errors in digitization by the ADC 10 can be small or large, and may significantly depend on the organization of the system, but in any event it is preferable to place the burden of accuracy on the DAC's rather than on the sub-ADC.

To illustrate the nature of one type of error that may occur, consider in the example of the 63-channel system given earlier, the $L_2$ level which equals 32 volts or 32 channels. Assume that the $L_2$ level in the ADC 10 can be in error by ±7 volts and that input signals to be analyzed are 26+$\epsilon$ volts and 38+$\epsilon$ volts, where $\epsilon$ is an increment much smaller than 1 volt. Thus, four cases may be analyzed: $L=32+7=39$ volts and $L=32-7=25$ volts, each with input signals of 26+$\epsilon$ and 38+$\epsilon$ volts. Substituting these numbers in Equation 3, the following is obtained:

For $v_1=26+\epsilon$:

$L_2=25; 39$ $N_1=32$ with $R_1=-(6+\epsilon)$; 16 with $R_1=10+\epsilon$ $N_2=0$;8 with $R_2=2+\epsilon$ $N_3=0;1$ $N=32; 25$ For $v_1=38+\epsilon$:

$L_2=25; 39$ $N_1=32$ with $R_1=6+\epsilon$; 16 with $R_1=22+\epsilon$ $N_2=4$ with $R_2=2+\epsilon$; 12 with $R_2=10+\epsilon$ $N_3=2; 3$ $N=38; 31$ It can be shown, as illustrated by the example $L_2=25$, $v_1=26+\epsilon$, that if a reference level of the sub-ADC is lower than it should be according to the previously stated relationships, and if the input signal has an amplitude with a critical range between the erroneous reference level and the proper level, a negative residue will occur in that step and all succeeding steps of the conversion. As a result, there will be no possibility of correcting the error during later steps of the analysis, and a relatively large error will occur.

As illustrated by the example $L_2=39$, $v_1=26+\epsilon$, if a reference level is higher than it should be, positive residues are produced, and errors made early in the conversion process can be corrected during later steps, in this instance resulting in only a small error in the final result, despite a large discrepancy at the start.

And finally, as illustrated by the example $L_2=39$, $v_1=38+\epsilon$, if a reference level is higher than it should be and if the input signal is within a critical range between the proper reference level and the erroneous level, positive residues occur which are so large that the amplifier may become overloaded during the next step of the conversion, producing significant errors in the result for this reason as well as from the inherent mathematical characteristics of the basic system under these conditions.

The examples given thus far were for relatively large errors in an ADC reference level. The next example illustrates the effect on the apparent width of an output channel resulting from a relatively small error in an ADC reference level.

Assume, now, that $L_2$ is 32.5 volts instead of the design value of 32.0 volts, and with input signals ranging from 31 to 33 volts, computation based on Equation 3 shows that one channel extends from (31+$\epsilon$) volts to (32.5−$\epsilon$) volts while the next channel extends from (32.5+$\epsilon$) volts to (33−$\epsilon$) volts. Thus, a reference level shift of +ΔE volts in a threshold level of E volts causes the channel immediately below E volts to be wider than it should properly be by ΔE volts, and the next higher channel to be narrower than it should be by ΔE volts.

In accordance with the present invention, in certain of its aspects, two alternative methods or system techniques are provided for reducing or eliminating errors of the above-described types.

With respect to one technique, when an ADC threshold is higher than it should be, any resulting error can be reduced or eliminated by making the amplifier gain variations between successive steps of the analysis to be less than the number of reference or threshold levels in the sub-ADC. In this manner, the possibility of obtaining a given channel number by more than one combination of counts from intermediate steps is introduced. For example, in the 63-channel system previously described, if the values of the successive gain variations of amplifier 14 are made less than by the number of ADC states by some integral factor, say, 1, instead of being equal to the number of ADC states, then $A_2/A_1=A_3/A_2=3$ instead of 4, and $Am=9$. This reduces the total number of channels, $N$, from 63 to 9(4)−1=35, based on Equation 2. If the criterion of 1 volt =1 channel is retained for ease of explanation and computation, then the threshold levels are changed from $L_3=48$, $L_2=32$, $L_1=16$ to $L_3=27$, $L_2=18$, $L_1=9$ volts. Then Equation 3 becomes:

$$N=N_1+N_2+N_3 \quad (5)$$

$$N_1=27H[v_1-27]+$$
$$18H[v_1-18]H[27-v_1]+$$
$$9H[v_1-9]H[18-v_1]H[27-v_1]$$

$$N_2=9H[3(v_1-N_1)-27]+$$
$$6H[3(v_1-N_1)-18]H[27-3(v_1-N_1)]+$$
$$3H[3(v_1-N_1)-9]H[18-3(v_1-N_1)]H[27-3(v_1-N_1)]$$

$$N_3=3H[9(v_1-N_1-N_2)-27]+$$
$$2H[9(v_1-N_1-N_2)-18]H[27-9(v_1-N_1-N_2)]+$$
$$H[9(v_1-N_1-N_2)-9]H[18-9(v_1-N_1-N_2)]H[27-9(v_1-N_1-N_2]$$

It may be noted that there is an element of redundancy in Eq. 5 in that the lowest count for $N_1$ is the same as the highest possible count for $N_2$, and the lowest count for $N_2$ is the same as the highest count for $N_3$. Thus, for example, a total count of $N=12$ could be accumulated in several ways:

| | | | | |
|---|---|---|---|---|
| $N_1=9$ | or | $N_1=0$ | or | $N_1=9$ |
| $N_2=0$ | | $N_2=9$ | | $N_2=3$ |
| $N_3=3$ | | $N_3=3$ | | $N_3=0$ |
| 12 | | 12 | | 12 |

These different ways of accumulating the same total count could result from an error in the value of the $L_1$ level in the sub-ADC or an error in the amplification factors of amplifier 14.

In an earlier example it was shown that an error of +ΔE volts in the actual value of an $L$-level in the ADC would cause a channel width variation of ΔE. In a system described by Eq. 5, this will not occur. For example, using Eq. 5, assume that the 9-volt threshold is in fact at (10−$\epsilon$) volts and examine the channel count for input signals ranging from 11 volts to 14 volts. It will be found that channels 12 and 13 (the critical ones) are in error by one-ninth volt, which is precisely $1/A_3=1/9$th as large as the original error of 1 volt in the threshold level. It can be shown in general that an error of ΔE volts in a threshold level will cause an error of $\Delta E/A_3$ in the width of channels in which that threshold level was involved during the third step of the analysis.

The second technique referred to earlier for improving the accuracy of the conversion process is to reduce or eliminate the possibility of obtaining a negative residue when an ADC level is lower than it should be. This may be accomplished in the following manner. At each but the last step in the digitizing process, prebias is inserted either at amplifier 14 or at the ADC by an amount which is one-half the difference between the total number of states in the ADC and the ratio of gains between that step and the preceding step, and to this is added the sum of the prebiases, weighted according to gain change, which will be added during all succeeding steps of the conversion. This may be accomplished by the switched bias network 32. For example, the total number of states in ADC 10 is defined as $k+1$, where $k$ is the number of levels above zero. If the ratio of gains between the last step in the analysis is $Am/A(m-1)$, then the "overlap" is $(k+1)-Am/A(m-b1)$, and if the prebias is added to the input of amplifier 14, the prebias at the next-to-the-last or $(m-1)$th step should be $$B_{(m-1)}=A_1/Am\ L_1/2\ (k+1-Am/A(m-1))\ \text{volts} \quad (6)$$

where $B_{(m-1)}$ is the prebias and the other symbols have the same meaning as in Equation 1.

For the $(m-2)$nd step, the prebias is:

$$B_{m-2}=B_{m-1}+A_1A_{m-1}\ L_1/2\ (k+1-A_{m-1}/A_{m-2}) \quad (7)$$

Thus, at the $i$th step in the process, $$B_i=L_1/2\sum_{i=1}^{m-1} A_1/A_{i+1}\left(k+1-\frac{A_{(i+1)}}{A_i}\right) \quad (8)$$

This may now be included in Eq. 5, if desired. For the purpose of illustration, however, the following example is given.

When Eq. 6 is applied to the example described by Eq. 5, the following is obtained:

$$B_2=1/9\ 9/2\ (3+1-9/3)\ \text{volts}$$
$$=0.5\ \text{volts}$$

Using Eq. 7 to compute $B_1$, we get:

$$B_1=0.5+1/3\ 9/2\ (3+1-3/1)\ \text{volts}$$
$$=2\ \text{volts}$$

Substituting in Eq. 5, and combining terms, the following is obtained:

$$N=N_1+N_2+N_3 \quad (9)$$
$$N_1=27H[v_1-29]+18H[v_1-20]H[29-v_1]+9H[v_1-11]H[20-v_1]H[29-v_1]$$
$$N_2=9H[3(v_1-N_1)-28.5]+6H[3(v_1-N_1)-19.5]H[28.5-3(v_1-N_1)]+3H[3(v_1-N_1)-10.5]H[19.5-3(v_1-N_1)]H[28.5-3(v_1-N_1)]$$
$$N_3=3H[9(v_1-N_1-N_2)-27]+2H[9(v_1-N_1-N_2)-18]H[27-9(v_1-N_1-N_2)]+H[9(v_1-N_1-N_2)-9]H[18-9(v_1-N_1-N_2)]H[27-9(v_1-N_1-N_2)a'$$

It should be noted that because of the way in which the bias terms enter Equation 9, the bias terms may be added to amplifier 14 or to ADC 10, in FIG. 1, provided that proper weighting is applied to accommodate the gain changes between the successive steps in the analysis operation.

A diagram showing all of the encoding levels referred to the input of amplifier 14 and graphically illustrating the example or mode of Eq. 9 is given in FIG. 4. FIG. 4 is similar to FIG. 2 but has the prebiasing terms added.

Now, if a bias of 2 volts is applied to the system during the first step of analysis, to avoid getting a negative residue, the ADC levels should be within ±2 volts of their design values. This is shown by the following example.

Assume an input signal $v_1$ of $(18+\epsilon)$ volts, and assume the 18-volt level of the ADC to be at 16 volts or 20 volts, then for $L_2=16$, $N_1=18$, Residue $=\epsilon$; $N_2=0$, Residue $=3\epsilon$; $N_3=0$; and $N=18$. For $L_2=20$, $N_1=9$, Residue $=9+\epsilon$; $N_2=6$, Residue $=3+\epsilon$; $N_3=3$; and $N=18$. Thus, in both cases, the correct answer is obtained.

In the system of FIG. 1, the biases $B_1$ and $B_2$ are switched into the amplifier 14 input in response to signals from the bias control 18 as determined by the clock pulses from the control timer 28 so as to supply the appropriate prebias value in each step of the analysis. Referring now to FIG. 3, during the first steps of analysis, from $t_0$ to $t_1$, the prebias $B_1$ is applied by switch $S_6$. At time $t_1$ the bias control 80 opens switch $S_6$ and closes switch $S_7$ to apply the prebias $B_2$ during the second step. At time $t_2$ the bias control 80 opens switch $S_7$ so that no prebias is applied from the network 32 during the third step. At some time $t_4$ later, the conversion is complete and read out, and the reset signal from the timer 28 may be utilized to actuate control 80 for closing switch $S_1$ once more in preparation for the next analysis sequence.

As shown in FIG. 4, the value of bias $B_1$ includes a term equal to bias $B_2$, so that bias $B_1$ may be generated by, for example, having both switches $S_6$ and $S_7$ closed, where one applies a magnitude of $B_2$ and the other applies a magnitude of $L/2\ A_1/A_2\ (k+1-A_2/A_1)$. Then, during step 2, the latter bias may be removed by opening the appropriate switch, leaving only bias $B_2$ applied. Other switching arrangements may, of course, be employed to provide the desired biases. Furthermore, it is understood that the choice of whether to add prebias to the ADC levels, subtract it from the input signal, or use a mixture of techniques is one of merely engineering convenience rather than fundamental to the prebiasing technique of the present invention. Additionally, while the optimum prebias would generally be that described above, the accuracy with which it is set may in some instances be rather poor, yet it still provides an increase in the accuracy of the system as compared with no prebias at all.

Turning now to a qualitative examination of the effects of errors in the gain settings of amplifier 14 and errors in DAC levels.

In the system described by Equation 1, the residue at the end of first step is $(v_1-N_1)$. During the second step, the residue is multiplied by $A_2/A_1$ and applied to the encoder. Because the DAC signals add directly to the input signals, there is no way of altering an error in a DAC level, either upwards or downwards. However, errors in the gain ratio $A_2/A_1$ will by cumulatively multiplied from step to step in the encoding process.

In the system described by Equation 5, errors in the gain ratios are multiplied only in the next succeeding step, but because of the redundancy, the errors are not cumulative from step to step as long as the errors in gain ratio do not cause errors which exceed the number of overlapping channels between successive steps. Thus, the true position of a particular channel edge at the end of an encoding sequence will be different from the desired location by the algebraic sum of all DAC errors which were involved prior to the final step, multiplied by the ratio of gain factors existing at the last and next-to-the-last steps; and algebraically added to this sum will be the error in the ADC level involved at that channel edge.

In selecting the bias levels to be applied during all but the last step, the formula of equations 6, 7 and 8 was given representing the optimum bias. Within the range of the overlap, more or less bias may be used, but this generally will restrict the range of error which can be tolerated in the amplifier gain ratios and in the ADC levels.

To obtain the shortest possible conversion time of an input signal, it is permissible and desirable to reduce the step duration of all but the final step in the conversion process. It is permissible to do so because the redundancy feature of this invention, as described by Equation 5, allows correction of the errors which result from incomplete output settling of amplifier 14 (in FIG. 1) following a sudden change in its input signal. In the last step, however, sufficient time is allowed for the amplifier output to settle to a level which is within the acceptable error for the system. Thus, in the example of FIG. 3, the greatest conversion speed may be attained by intentionally decreasing the intervals $[t_1-t_0]$ and $[t_2-t_1]$ sufficiently to actually create a certain amount of erroneous operation during these first two steps, as long as the interval $[t_3-t_2]$ is of sufficient duration to allow the system to reach equilibrium during this last step.

In the discussion to follow, three particular circuit configurations are illustrated and described for switching the gain of the amplifier 14 and two circuit configurations are illustrated and described for introducing the prebias of biasing network 32. In one of these configurations, a single switching network both removes the bias and increases the gain during the analysis operation. Referring now to FIG. 5, there is shown an inverting amplifier 200 having an absolute gain $A>>1$, an input coupling resistor $R_1$, two feedback resistors $R_2$ and $R_3$ and a transistor 202. The transistor 202 may be a conventional bipolar transistor with its collector connected to feedback resistor $R_2$, its base to control lead 204, and its emitter to the output of the amplifier 200, or it may be a field-effect transistor (hereinafter abbreviated FET), or any of the class of insulated gate transistors with drain (D), gate (G), and source (S), connected respectively to each of the above-mentioned points. If, when the base or gate 204 is in a negative state, the transistor or FET is nonconducting, resistor $R_2$ is disconnected from the circuit and the nominal gain is $R_3/R_1$. If the transistor or FET is placed into saturation by the application of a sufficiently large positive pulse 206 to the base or gate, then $R_2$ is connected between the output and input of the amplifier, effectively shunting $R_3$. The nominal gain then becomes $R_2R_3/R_1(R_2+R_3)$. The ratio of gains before and after the switching is $(R_2+R_3)/R_2$. By employing a plurality of such circuit configurations in cascade or by utilizing a plurality of shunt resistor-transistor branches with a single amplifier circuit, any number of different amplification factors may controllably be effected. By locating the transistor or FET as shown, base or gate current flows into the output terminal of the amplifier rather than into the input terminal, thereby providing an insignificant offset in the output voltage thereof.

In the circuit configuration of FIG. 6, which is an alternative form, the same general components are employed, being designated with a prime, but the resistor $R_3'$ is connected across the transistor or FET 202′ rather than across the amplifier 200′. In this configuration the gain of the system is $(R_2+R_3)/R_1$ when the transistor or FET is nonconducting, and $R_2/R$ when it is. The ratio of gains before and after switching into conduction is $(R_2+R_3)/R_2$. As with the circuit of FIG. 5, the transistor 202′ may be placed in conduction by the positive pulse 206′ applied to the gate or control lead 204′.

In FIG. 7, a preferred gain-switching system is shown in which a diode bridge 210, comprising eight diodes, $D_1$ through $D_8$, is employed as the switching element in the shunt connection with the amplifier 200″. Like the circuits in FIGS. 5 and 6, an input coupling resistor $R_4$ is provided and, like the circuit of FIG. 5, a feedback resistor $R_5$ is provided in shunt with the amplifier 200″. Switching is accomplished by closing switches 212 and 216a which pass a current from a positive potential through lead 214, to a relatively negative potential through lead 216 and switch 216a. This current places all of the diodes into conduction and, with matched diodes, there is essentially no voltage difference between junctions or nodes 218 and 220. With switches 212 and 216a open and the current off, the diodes become nonconducting and a potential is permitted to develop across the nodes 218 and 220. Thus, with switches 212 and 216a closed, a conductive path is effectively provided that places the feedback resistor $R_6$ in shunt with the amplifier 200″ and feedback resistor $R_5$. This circuit is similar to that shown in FIG. 5 regarding gain. That is, with switches 212 and 216a open, the gain is $R_5/R_4$, but with the switches closed, it is $R_6R_5R_4\ (R_6+R_5)$. Two resistors designated $R_x$ are of equal resistance and much larger than $R_5$, and serve to keep the voltage across $D_2$ and $D_3$ accurately at zero, thereby eliminating leakage current through these diodes into the input of the amplifier 200″. Resistors $R_x$ are each respectively coupled from the adjacent diodes $D_1$, $D_2$ and $D_3$, $D_4$ on the amplifier input side of the network to ground.

The circuit arrangement of FIG. 7 is advantageous over that of FIG. 5 since the symmetry results in the junctions 218 and 220 being at the same potential and the diode resistance does not cause an error in gain by adding an unknown resistance to $R_6$. In the circuit of FIG. 5, the saturation resistance of the switching transistor or FET 202 appears in series with $R_2$, and this resistance may vary in an unpredictable manner because of the temperature coefficient of resistance of semiconductors. For example, it may be noted that the ratio of nominal gains for the circuit of FIG. 5 is actually $R_2+R_3+r/R_2+r$ where $r$ is the saturation resistance of the transistor.

Another advantage of the diode switching network of FIG. 7 is that hot carrier diodes may be used. These diodes exhibit much lower values of stored charge than do transistors of FETs, with a resulting reduction in switching transients and an increase in switching speed. Alternatively, the circuit of FIG. 7 may be modified so as to be similar to that of FIG. 6 by moving the resistor $R_5$ to connected nodes 218 and 220. The ratio of nominal gains would be $(R_6+R_5)/R_6$.

Figures 8, 9:
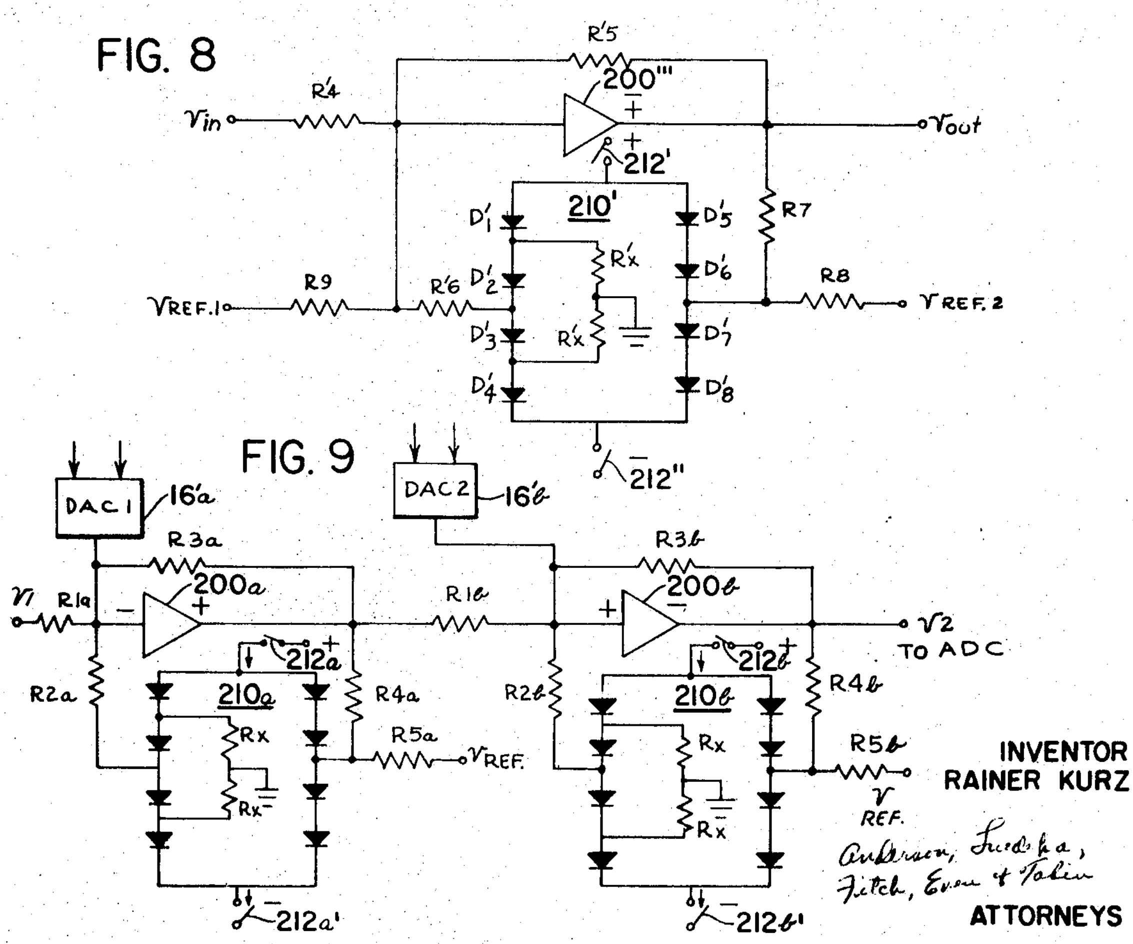

Referring now to FIG. 8, there is shown a circuit configuration for introducing a fixed bias to the signal of the amplifier 200‴, while also changing the circuit gain. This circuit is similar to that of FIG. 7 with the addition of coupling resistors $R_7$, $R_8$ and $R_9$, and reference voltages $V_{ref1}$ and $V_{ref2'}$ the reference voltages preferably corresponding to the selected bias values in accordance with the system of FIG. 1 and the biasing means 32, previously discussed. The resistor $R_8$ couples the reference voltage $V_{ref2}$ to the output terminal via resistor $R_7$, and resistor $R_9$ couples the reference $V_{ref1}$ to the amplifier input. With this circuit configuration, if bias is added by means of $V_{ref1}$, the gain of the circuit with respect to $v_{in}$ is unchanged, but a bias of $V_{ref1}\ R_4'/R_9$ is added with respect to $V_{in}$ regardless of the gain $v_{out}/v_{in}$. Further, if bias is added via $V_{ref2}$ it is effective only during the time when the diodes $D_1'$ through $D_8'$ are conducting (when switches 212′ and 212″ are closed). Disregarding the presence of $R_5'$, the gain and bias can be computed from the following relationship:

$$v_{out}=-v_{in}\ R_6'/R_4'\ 1+R_7/R_6'+R_7/R_8-R_7/R_8\ V_{ref2'}$$

This equation shows that the bias adds a fixed voltage to the output regardless of input signal. If $R_5'$ is taken into account, this equation becomes:

$$v_{out}=-v_{in}\frac{R_5'}{R_4'}\frac{S}{SR_5'/R_6'}-V_{ref\,2}\frac{H_5'R_7}{R_6'R_8}\frac{1}{S+R_5'/R_6'}$$

where $S=1+R_7/R_6'+R_7/R_8'$

As before, the bias adds a fixed voltage to the output regardless of input signal.

In the digitizing system of FIG. 1, and in conjunction with the prebiasing techniques employing biasing means 32 for minimizing errors which might be introduced by the ADC 10, it was necessary to switch out the prebias in the high gain position of the amplifier, i.e., in the third step of analysis. However, when using $V_{ref2}$ in the circuit configuration shown in FIG. 8, both gain switching and bias switching are accomplished simultaneously with but a single switched parameter, viz., the current through the bridge 210′. The gain of the circuit is increased and the bias $V_{ref2}$ is removed when switches 212′ and 212″ are opened. If $V_{ref1}$ is used, both it and the current through the bridge must be switched if the desired effects is to be accomplished. As with the circuit of FIG. 5, a plurality of such circuits may be employed to achieve any number of different amplification factors to provide the desired gain ratios for each successive step in the analysis operation. It will be understood, of course, that the biasing technique employed in conjunction with the circuit of FIG. 8 may also be applied to the circuits of FIGS. 5 and 6.

With respect to the amplifier 14, generally illustrated in FIG. 1, if the gain required becomes so high that bandwidth and offset at the summing junction 18 over the required dynamic range are adversely affected, it may become desirable to cascade two (or more) amplifiers. A practical circuit configuration for accomplishing this is shown in FIG. 9. The cascaded amplifier circuits are each of the same type as described in connection with FIG. 8, and include high-gain amplifiers 200a and 200b, and each circuit employs a reference voltage $V_{refa}$ and $V_{refb}$ coupled to its respective output. The corresponding components of each of the cascaded circuits are respectively designated with the suffixes *a* and *b*. The DAC's 16'*a* and 16'*b* are each respectively connected to one of the amplifying stages as illustrated, and correspond to the DACs 16*a* and 16*b* in the system of FIG. 1. In this arrangement, if both diode bridges 210*a* and 210*b* are nonconducting (switches 212*a*, 212*a*', 212*b*, and 212 *b*' open), the system gain is very nearly the following:

$$v_2/v_1=R_{3a}R_{3b}/R_{1a}R_{1b}$$

where $R_{3a}$ and $R_{3b}$ are the respective feedback resistors of each of the sections or stages, and $R_{1a}$ and $R_{1b}$ are the respective input resistors of each stage. This is the maximum gain of the amplifier system and assumes that no $V_{ref}$ bias is applied.

If switches 212*a* and 212*a*' are closed and the bridge 210*a* in the first section is conducting, the gain and offset of section a are described by the equation for the circuit of FIG. 8, with appropriate substitution of component values. If switches 212*b* and 212*b*' are closed and the bridge 210*b* in the second section is conducting, again this equation applies, but with suitable modification again for the corresponding components. As can be seen, the utilization of a circuit arrangement as illustrated in FIG. 9 permits up to four different amplification factors to be effected in a convenient and readily controllable manner. However, only three different amplification factors are utilized in the system of FIG. 1.

It should be noted that because only amplifier gains in the last and the next-to-the-last steps contribute to channel-width error, it is desirable that the gains in these steps involve as few active circuit elements as possible. It is for this reason that in each of the amplifier configurations in FIGS. 5 through 9, the transistors or diodes are in the nonconducting condition when the amplifier gains are at their highest values. Thus, in the circuit arrangement of FIG. 9, $A_3$ is preferably provided by switches 212*a*, 212*a*', 212*b*, and 212*b*' being in their open condition, $A_2$ may be provided by one pair of switches being open and the pair being closed, and $A_1$ may be provided by the opposite switch conditions as compared with those for $A_2$. This switching would, of course, be normally done by any well-known type of suitable electronic switching circuitry under the control of the control timer 28, in a manner previously described. It may be here noted that the circuit configuration of FIG. 9 performs the function of bias control 80 (FIG. 1) with respect to switching prebias values, and does so automatically with each change in gain.

It is to be understood that although the amplifier arrangements herein described have particular advantages in the present overall system, they may of course be advantageously used in other applications.

The ADC 10 may be in the form of a serial-type amplitude-to-time converter or a standard binary successive-approximations converter. The serial type of amplitude-to-time converter can be quite fast if a small number of channels are used, but in the standard binary successive-approximations converter, the serial aspect of the decoding process is slower that it would be if a parallel type of encoder were used. In a particular construction of a system in accordance with the present embodiment of the invention, a multilevel, parallel-input encoder was employed, having a group of comparators biased at equally spaced levels. An example of this type of encoder or ADC is illustrated in block form in FIG. 10, as the ADC 10 for the system of FIG. 1.

Three comparators 302, 304, and 306 each have one input coupled to the output of the amplifier 14 and the other input coupled to reference levels $L_1$, $L_2$ and $L_3$, respectively. The output of each comparator is coupled to a Gray encoder 308 and the output thereof is fed to a Gray-to-Binary encoder 310 through latching circuits 312 and 314 in each of the coupling leads. The output of the encoder 310 is the straight binary code $Q_1$, $Q_2$ illustrated in FIG. 1. The latching circuits 312 and 314 are controlled by a gating circuit 316 which, in turn, is driven by the clock pulses from the control timer 28. The latches are gated prior to each "set" pulse fed to the registers 20, but after a sufficient duration in each step to permit the Gray encoder output to settle or reach equilibrium. This aids in preventing errors in the binary encoder 310 output.

To minimize the number of DAC levels required, the DAC elements should be weighted according to a binary sequence. Since a multilevel encoder does not have a binary coded output, a conversion is required. The converter could be a conventional binary converter, but this may be generally undesirable because at the higher binary numbers, several stages can switch simultaneously. The resulting transients add and can adversely affect the operation of circuits which follow the converter. To avoid this, it is desirable to follow the multilevel comparator with a Gray-code converter 308 in which only one stage at a time can switch, and then to convert to straight binary with the conventional binary encoder 310.

Since ADC 10 in FIG. 1 controls DAC elements 16, and since for reasons of economy and to minimize the possible sources of error it is desirable to use DAC levels which are arranged in a binary sequence, it follows that there are preferred numbers of levels in the ADC. Thus, if there are two DAC levels with weights of 1 and 2, 3 states are possible: 1, 2 and 1+2. These two DAC elements are conveniently controlled by three comparators having equally spaced levels. Two comparators would be too few and more than two would be unnecessary. If three DAC levels are used with weights 1, 2 and 4, then seven states are possible and a seven-level comparator is the minimum which can control it. More than seven levels would be unnecessary. Similarly, if four DAC levels are required, a 15-level ADC makes the most efficient fit.

Thus, a serial-parallel analogue-to-digital converter system has been described which utilizes a conventional low-state or sub-ADC with at least one amplifier which may be set at different amplification factors by a clock signal generator or by any other suitable means, a conventional digital-to-analogue converter, and an arithmetic device to generate the digital output signal. The conventional ADC is utilized several successive times at increasingly higher sensitivity through the use of the amplifier which may have its gain increased and its zero offset changed with each succeeding use of the ADC.

A particular system in accordance with the present embodiment was constructed having a resolution of 11 bits and an encoding time of 3 microseconds, independent of channel number. This sort encoding time makes multiplexing of several independent or dependent channels possible. Measured integral nonlinearity over all channels was less than 0.005 percent and differential linearity was in the order of 0.15 percent TTL integrated circuits were used for digital operations in the system.

Although particular embodiments of the present invention have been illustrated and described, various modifications of the overall systems, methods and the particular features and aspects thereof will be apparent to those skilled in the art; and accordingly, the scope of the invention should be defined only by the appended claims and equivalents thereof.

Various features of the invention are set forth in the following claims.

I claim:

1. A system for converting data in analogue form to digital form and having a predetermined number of quantitizing channels comprising an analogue-to-digital converter having a number of quantitizing channels less than said predetermined number, amplifying means having an input responsive to the analogue signal to be digitized and providing an output signal characterized as being the product of the input signal and the amplification factor of said amplifying means, means coupling the output of said amplifying means to the analogue input of said converter, means for controllably sequentially varying the amplification factor of said amplifying means from a first value to a predetermined number of successively higher values, each corresponding to a separate step of analysis of the analogue input signal, means responsive to the digital output of said converter during each successive step for providing signals indicative of the respective products of each digital output of said converter and multiplying factor, each successive multiplying factor being respectively characterized by the ratio of the highest and each successively lower amplification factor to the lowest amplification factor thereby expanding the digital output of said converter from said lesser number to said predetermined number of channels, a digital-to-analogue converter also responsive to said digital output for providing during each successive step an analogue feedback signal indicative of the lower level of the particular digital channel of said analogue-to-digital converter output, means for combining said feedback signal with said analogue input signal so as to supply to the analogue input of said analogue-to-digital converter a combined signal characterized by the difference between them so that there are provided expanded signal outputs corresponding to the resulting products of each step, and means for summing each of said products to provide a digital output associated with one of said predetermined number of channels corresponding to said analogue input signal.

2. The system of claim 1 comprising timing means for generating electrical pulses at predetermined intervals and means for coupling said pulses to said means for sequentially varying the amplification factor of said amplifying means so that the amplification factor is maintained at said first value during the first of said intervals and is changed to each of said successively higher values during each successive one of said intervals.

3. The system of claim 2 wherein all of said predetermined intervals are of equal duration, said duration being sufficiently long to allow the system to reach equilibrium during each step of the analysis.

4. The system of claim 1 comprising an adjustable bias means for applying a DC bias signal to said amplifying means whereby any input offset of the system may be canceled by the introduction of said bias in an equal magnitude to said offset but with opposite polarity.

5. The system of claim 1 comprising means for producing amplifier gain variations between successive steps of the analysis which are equal to the number of channels of said analogue-to-digital converter.

6. The system of claim 1 comprising means for producing amplifier gain variations between successive steps of the analysis which are less than the number of channels in said analogue-to-digital converter, whereby an error-correcting redundancy is introduced into the system.

7. The system of claim 6 comprising timing means for generating electrical pulses at predetermined intervals and means for coupling said pulses to said means for sequentially varying the amplification factor of said amplifying means so that the amplification factor is maintained at said first value during the first of said intervals and is changed to each of said successively higher values during each successive one of said intervals, all of said intervals prior to the last interval being of shorter duration than said last interval so that only said last interval is sufficiently long to allow the system to reach equilibrium therein.

8. The system of claim 1 comprising means for providing prebias signals having particular values corresponding to each but the last successive step of analysis, and means for combining said prebias signals with the analogue input signal to the analogue-to-digital converter so that the particular values of prebias applied in each but the last step substantially eliminate the possibility of obtaining a negative residue during said successive steps of the analysis.

9. The system of claim 1 comprising means for providing preselected values of prebias signals during predetermined steps of the analysis operation, means for selectively coupling said preselected prebias signals to the analogue input of said analogue-to-digital converter so that the prebias signal magnitude at each but the last step in the operation is the sum of the quantity one-half the difference between the total number of channels in the analogue-to-digital converter and the ratio of gains between the gain in said each step and the preceding step and the quantity given by the sum of the preselected biases, weighted according to their corresponding gain changes, if any, which will be added during all succeeding steps of the operation.

10. The system of claim 1 comprising means for inserting a preselected bias to the input of said amplifying means during each but the last step of the operation, said means including means for providing said bias values according to the following relationship:

$$B_i=\frac{L_1}{2}\sum_{i=1}^{m-1}\frac{A_1}{A_{i+1}}\left(k+1-\frac{A_{(i+1)}}{A_i}\right)$$

where $B_i$ is the preselected bias applied during the $i$th step of the operation;

$m$ is the total number of steps in the conversion operation;

$A_1$ is the gain of said amplifying means during the first step;

$A_i$ is the gain of said amplifying means during the $i$th step;

$k+1$ is the number of channels in said analogue-to-digital converter; and $L_1$ is the first reference level in said analogue-to-digital converter.

11. The system of claim 1 wherein said amplifying means includes a high-gain amplifier and an input resistor coupled thereto, and said means for varying the amplification factor of said amplifying means comprises the series combination of resistance means and controllable switching means, said series combination being connected in parallel across said amplifier so that the gain of said amplifying means is greater when said switching means is in its nonconductive condition than when it is in its conductive condition, whereby the greatest error which may be introduced by said switching means resistance occurs during the low-gain condition of said amplifying means.

12. The system of claim 11 wherein said switching means comprises a semiconductor switching device having three terminals including a control terminal, the remaining two terminals being in the series combination and being arranged with respect to the control signal polarity applied to the control terminal for switching to cause the control terminal current to flow into the output of the amplifier, whereby any offset at said output is minimized.

13. The system of claim 11 wherein said switching means comprises a diode bridge circuit having two control terminals, two controlled terminals, and at least one rectifier diode in each arm of the bridge, all of said diodes being connected with the same polarity with respect to said control terminals, said bridge having its controlled terminals connected in said series combination so that the bridge presents an open circuit thereto when no current flows through said control terminals, but a closed circuit when current flows through the bridge.

14. The system of claim 13 comprising means for resistively coupling a bias signal to the output of said amplifier and to one of said controlled terminals of said bridge, said one controlled terminal being also resistively coupled to the output of said amplifier, whereby both the gain of said amplifier and its output offset are simultaneously changed by predetermined amounts by the passing of current through said control terminals of said bridge.

15. The system of claim 13 wherein a plurality of said amplifying means and said means for varying the amplification factor of said amplifying means are coupled together in a cascade arrangement, said system further comprising a corresponding plurality of switching means for controlling current flow through each of the diode bridges so that all of the bridges present an open circuit to provide the highest amplification factor of said amplifying means in the last step of the operation.

16. The system of claim 15 comprising means for resistively coupling a bias signal to the output of each amplifier and to one of said controlled terminals of each of said bridges, said one controlled terminal of each bridge being also resistively coupled to the output of its respective amplifier so that the conductive condition of each bridge controls the application of each bias, each bias signal having such a value in each successive step that when it is combined with the analogue input signal the possibility of producing a negative residue is substantially eliminated in each step of the operation.

17. The system of claim 1 wherein said analogue-to-digital converter comprises a plurality of comparators defining each of the channels thereof, means for converting the output of said comparator to a Gray code, and means for converting said Gray code to a straight binary code.

18. A system for converting data in analogue form to digital form having a predetermined number of quantitizing channels at its output, said system comprising an analogue-to-digital converter having $k$ reference levels and $k+1$ channels, where $L_1$ is the lowest level and $L_k$ is the highest level, and where $k+1$ is substantially less than said predetermined number of quantitizing channels, amplifying means having an input responsive to an analogue input signal, $v_1$, means coupled to said amplifying means for varying the amplification factor thereof to successively higher values $A_1, A_2 \ldots A_m$, in respective successive separate steps of analysis and conversion of the signal $v_1$ to a digital output associated with N of said quantitizing channels, arithmetic means responsive to each successive output of the analogue-to-digital converter to provide a weighted digital cumulative count from each step, and circuit means intercoupling the output of said converter to its input so that the number N of said quantitizing channels for said conversion of $v_1$ is given by the relationship $$N=\sum_{i=1}^{m}\frac{A_{(m-i+1)}}{A_1}kH\left[A_i\left(v_1-L_1\sum_{1}^{i-1}N_n\right)-L_k\right]$$

$$+\frac{A_{(m-i+1)}}{A_1}(k-1)H\left[A_i\left(v_1-L_1\sum_{1}^{i-1}N_n\right)-L_{(k-1)}\right]$$

$$H\left[L_k-A_i\left(v_1-L_1\sum_{1}^{i-1}N_n\right)\right]\ldots$$

$$H\left[A_i\left(v_1-L_1\sum_{1}^{i-1}N_n\right)-L_1\right]H\left[L_2-A_i\left(v_1-L_1\sum_{1}^{i-1}N_n\right)\right]$$

$$\ldots H\left[L_k-A_i\left(v_1-L_1\sum_{1}^{i-1}N_n\right)\right]$$

where $m$ is the number of steps in the analysis, $A_i$ is the amplification factor at the $i$th step in the analysis, $H$ is the Heaviside operator, $N_n$ is the number of channel counts during an earlier step of the analysis, and $A_{(m-i+1)}/A_1$ is the weighting factor by which said each successive output of the analogue-to-digital converter is multiplied.

19. The system of claim 18 wherein said circuit means includes a digital-to-analogue converter, and wherein a residue is produced at the end of the $i$th step which exceeded the $(k-1)$th reference level but not the $k$th level, said residue being given by $$A_i\left(v_1-L_1\sum_{1}^{i-1}N_n\right)-L_{(k-1)}\text{ where }L_1\sum_{1}^{i-1}N_n$$

is the sum of all of the digital-to-analogue converter levels combined with the input to the analogue-to-digital converter during the $(i-1)$ preceding steps of the analysis.

20. The system of claim 19 comprising means for maintaining $A_{i+1}/A_i$ less than $k+1$ in each successive step of the operation.

21. A method for converting data in analogue form to digital form by providing a predetermined number of channels in which to quantitize the analogue input data, said method comprising the steps of successively supplying the analogue input, multiplied by successively higher factors, to an analogue-to-digital converter having a number of channels substantially lower than said predetermined number, successively subtracting an amount from the input to said converter corresponding to the channel output thereof to provide successive residues therefrom, multiplying each successive residue by a weighting factor associated with each successive multiplier factor to expand the output of the converter to said predetermined number of channels, and summing all of the separate products of each respective weighting factor and residue.

22. The method of claim 21 wherein said successively higher factors are successively increased by an amount less than the number of channels in the analogue-to-digital converter.

23. The method of claim 21 comprising the further steps of subtracting from the input to said converter, at each but the last step of analysis, the sum of the quantity of one-half the difference between the number of channels of said converter and the ratio of successive multiplier factors in said each step to the preceding step and the quantity given by the sum of the further amounts which will be added thereto during all succeeding steps of the analysis.

24. Apparatus for converting an analogue signal to digital form by providing a predetermined number of output channels to quantitize the analogue input signal, said apparatus comprising means for successively supplying the analogue input signal, multiplied by successively higher factors, to an analogue-to-digital converter having a number of channels substantially lower than said predetermined number, means for successively substracting an amount from the input signal to said converter corresponding to the channel output thereof to provide successive residues therefrom, means for multiplying each successive residue by a weighting factor associated with each successive multiplier factor to expand the output of the converter to said predetermined number of channels, and means for summing all of the separate products of each respective weighting factor and residue to provide an output in said digital form.

25. The apparatus of claim 24 comprising means for increasing the successively higher multiplier factors by an amount less than the number of channels in the analogue-to-digital converter.

26. The apparatus of claim 24 comprising means for subtracting from the input to said converter, at each but the last step of analysis, a prebias corresponding to the sum of the quantity of one-half the difference between the number of channels of said converter and the ratio of successive multiplier factors in said each step to the preceding step and the quantity given by the sum of the further amounts which will be added thereto during all succeeding steps of the analysis.

* * * * *

UNITED STATES PATENT OFFICE
CERTIFICATE OF CORRECTION

Patent No. 3,646,586 Dated February 29, 1972

Inventor(s) Rainer Kurz

It is certified that error appears in the above-identified patent and that said Letters Patent are hereby corrected as shown below:

Column 4, lines 11 and 12, delete "analysis of the various errors which might arise will then";
Column 4, line 64, after "period" insert -- ) --;
Column 4, line 66, after "is" insert -- a --;
Column 6, line 1, change "relays" to -- switches --;
Column 6, line 45, after"discussion" add -- to effect a simplification --.
Column 8, line 27, change "weighing" to -- weighting --.
Column 9, lines 65-70, correct the first two lines of the equation to read:

$$N_i = \left(\frac{A(m-i+1)}{A_1}\right) k\ H[A_1(v_1 - L_1 \sum_{1}^{i-1} N_n) - L_k]$$

$$+\left(\frac{A(m-i+1)}{A_1}\right) (k-1)\ H[A_1(v_1 - L_1 \sum_{1}^{i-1} N_n) - L(k-1)$$

Column 11, change line 24 to read: -- $32H[v_1-32]H[48-v_1]+$ --;
Column 11, change line 29 to read -- $N_3 = 3H[16(v_1-N_1-N_2)-48]+$ --.
Column 11, line 38, change "$V_1$" to -- $v_1$ --.
Column 15, line 16, change the expression "(M-bl)" to -- (M-1) --;
Column 15, line 23, change the expression "$+A_1A_m-1$" to -- $+A_1/A_{m-1}$ --;
Column 15, line 54, change "$-N_2)a'$" to -- $-N_2)]$ --.

Column 16, line 17, change the expression before the period "." to -- $(L/2)(A_1/A_2)(k+1-A_2/A_1)$ --.

FORM PO-1050 (10-69)
USCOMM-DC 60376-P69
☆ U.S. GOVERNMENT PRINTING OFFICE : 1969 O—366-334.

UNITED STATES PATENT OFFICE
CERTIFICATE OF CORRECTION

Patent No 3,646,586 Dated February 29, 1972

Inventor(s) Rainer Kurz PAGE 2

It is certified that error appears in the above-identified patent and that said Letters Patent are hereby corrected as shown below:

Column 17, line 47, change "with" to -- to --;
Column 17, line 61, change "200" to -- 200 --.

Column 18, line 13, change "connected" to -- connect --;
Column 18, line 14, after "would" add -- then --;
Column 18, line 30, change "$V_{ref2}$" to -- $V_{ref2}'$ --;

Column 18, line 34, change the expression to read
-- $V_{out} = -V_{in} R_6'/R_4'(1+R_7/R_6'+R_8)-(R_7/R_8)V_{ref2}'$ --;
Column 18, line 56, change "effects" to -- effect --.
Column 19, line 54, change "that to -- than --.
Column 20, line 40, change "sort" to -- short --.
Column 23, (Claim 18), line 35 before the "..." add -- + --;
Column 23, (Claim 18), line 47 change the expression therein to read -- $A_{(m-i+1)}/A$ --.

Column 24, (Claim 20), lin- 4, change the expression to read -- $A_{i+1}/A_1$ --.

Column 24, (Claim 24), line 39 change "substracting" to -- subtracting --.

Signed and sealed this 23rd day of July 1974.

(SEAL)
Attest:

McCOY M. GIBSON, JR.
Attesting Officer

C. MARSHALL DANN
Commissioner of Patents

FORM PO-1050 (10-69)

USCOMM-DC 60376-P69
☆ U.S. GOVERNMENT PRINTING OFFICE : 1969 O—366-334.